(12) United States Patent
Kim et al.

(10) Patent No.: US 11,871,635 B2
(45) Date of Patent: Jan. 9, 2024

(54) DISPLAY PANEL AND DISPLAY DEVICE

(71) Applicant: Samsung Display Co., Ltd., Yongin-Si (KR)

(72) Inventors: Sang Hoon Kim, Seoul (KR); Seungchan Lee, Hwaseong-si (KR); Gun Hee Kim, Seoul (KR); Donghyun Kim, Seoul (KR); Soohyun Moon, Incheon (KR); Joohee Jeon, Hwaseong-si (KR); Sungjin Hong, Seoul (KR); Taehoon Yang, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 734 days.

(21) Appl. No.: 16/883,943

(22) Filed: May 26, 2020

(65) Prior Publication Data

US 2020/0411606 A1    Dec. 31, 2020

(30) Foreign Application Priority Data

Jun. 28, 2019    (KR) .................. 10-2019-0077605

(51) Int. Cl.
*H01L 21/00* (2006.01)
*H10K 59/35* (2023.01)
*H10K 59/00* (2023.01)
*H10K 59/121* (2023.01)
*H10K 59/131* (2023.01)

(52) U.S. Cl.
CPC .......... *H10K 59/353* (2023.02); *H10K 59/00* (2023.02); *H10K 59/121* (2023.02); *H10K 59/131* (2023.02)

(58) Field of Classification Search
CPC .................................................. H10K 59/131
See application file for complete search history.

(56) References Cited

U.S. PATENT DOCUMENTS

| 8,816,331 | B2 | 8/2014 | Choi et al. |
| 9,437,132 | B2 | 9/2016 | Rappoport et al. |
| 2014/0071030 | A1 | 3/2014 | Lee |
| 2014/0183479 | A1 | 7/2014 | Park et al. |
| 2016/0149165 | A1 | 5/2016 | Kim |

(Continued)

FOREIGN PATENT DOCUMENTS

| CN | 108039357 A | 5/2018 |
| CN | 108766990 A | 11/2018 |

(Continued)

OTHER PUBLICATIONS

European Communication corresponding to European Patent Application No. 20182869.6 dated Mar. 16, 2021 19 pages.

(Continued)

*Primary Examiner* — Douglas M Menz
(74) *Attorney, Agent, or Firm* — Innovation Counsel LLP

(57) ABSTRACT

Disclosed are display panels and display devices. The display panel comprises a base layer which includes a first region and a second region having a first sub-region and a second sub-region, first pixels in the first region, and second pixels in the first sub-region. Each of the first and second pixels includes a pixel electrode, an emission layer on the pixel electrode, and a common electrode on the emission layer. The pixel electrode is shifted relative to the emission layer in a direction away from the second sub-region.

14 Claims, 26 Drawing Sheets

(56) References Cited

U.S. PATENT DOCUMENTS

| | | |
|---|---|---|
| 2017/0150618 A1 | 5/2017 | Choi et al. |
| 2018/0089485 A1 | 3/2018 | Bok |
| 2019/0250450 A1 | 8/2019 | Li |
| 2020/0058726 A1 | 2/2020 | Ma et al. |
| 2020/0127061 A1 | 4/2020 | Zou |

FOREIGN PATENT DOCUMENTS

| | | |
|---|---|---|
| CN | 109037298 A | 12/2018 |
| CN | 109448575 A | 3/2019 |
| JP | 2010-230797 A | 10/2010 |
| KR | 10-2012-0124224 A | 11/2012 |
| KR | 20170024182 A | 3/2017 |
| KR | 20170140136 A | 12/2017 |
| KR | 10-2018-0092055 A | 8/2018 |

OTHER PUBLICATIONS

European Communication corresponding to European Patent Application No. 20182869.6 dated Nov. 20, 2020 19 pages.

DISPLAY PANEL AND DISPLAY DEVICE

CROSS-REFERENCE TO RELATED APPLICATION

This U.S. nonprovisional application claims priority under 35 U.S.C. § 119 to Korean Patent Application No. 10-2019-0077605 filed on Jun. 28, 2019 in the Korean Intellectual Property Office, the entire contents of the Korean Patent Application which is hereby incorporated by reference.

BACKGROUND

The technical field relates to a display panel and a display device.

A display device may consist of various electronic components such as a display panel for displaying images, an input sensing member for detecting external input, and an electronic module. The electronic components may be electrically connected to each other through signal lines. The display panel may include a light emitting element generating light. The input sensing member may include sensing electrodes for detecting external inputs. The electronic module may include a camera, an infrared sensor, a proximity sensor, or the like. The electronic module may be disposed underneath the display panel.

SUMMARY

Some example embodiments of the present inventive concept provide a display panel and a display device whose electronic module has an increased sensitivity.

According to some example embodiments of the present inventive concept, a display panel may comprise: a base including a first region and a second region, the second region including a first sub-region and a second sub-region; a plurality of first pixels on the first region; and a plurality of second pixels on the first sub-region. Wherein each of the first pixels may include a first pixel electrode, a first emission layer on the first pixel electrode, and a first common electrode on the first emission layer. Wherein each of the second pixels may include a second pixel electrode, a second emission layer on the second pixel electrode, and a second common electrode on the second emission layer. Wherein the second pixel electrode may be shifted relative to the second emission layer in a direction away from the second sub-region.

In certain embodiments, each of the first and second sub-regions may be provided in a plurality. Wherein the plurality of first sub-regions and the plurality of second sub-regions may be alternately defined in a first direction. Wherein the plurality of first sub-regions and the plurality of second sub-regions may be alternately defined in a second direction intersecting the first direction.

In certain embodiments, the first sub-region and the second sub-region may be adjacent to each other in a first direction. Wherein a center of an overlapping region may be spaced apart in the first direction from a center of the second emission layer, the second emission layer overlapping the second pixel electrode in the overlapping region.

In certain embodiments, a center of an overlapping region where the first emission layer overlaps the first pixel electrode may be spaced apart from a center of the first emission layer in a direction opposite to the first direction.

In certain embodiments, each of the first emission layer, the first pixel electrode, the second emission layer, and the second pixel electrode may have a quadrangular shape.

In certain embodiments, an area of the first emission layer is greater than an area of the first pixel electrode. Wherein an area of the second emission layer may be greater than an area of the second pixel electrode.

In certain embodiments, the first sub-region and the second sub-region may be adjacent to each other in a first direction. Wherein a first overlapping region may be defined where the first pixel electrode overlaps the first emission layer. Wherein a second overlapping region may be defined where the second pixel electrode overlaps the second emission layer. Wherein the first overlapping region may be spaced apart from the second overlapping region in a second direction intersecting the first direction. Wherein an imaginary line may not overlap a center of the first overlapping region. The imaginary line may penetrate a center of the second overlapping region and may extend in the second direction.

In certain embodiments, no pixel may be disposed on the second sub-region.

In certain embodiments, the first emission layer may be provided in a plurality. Wherein the second emission layer may be provided in a plurality. Wherein the plurality of first emission layers and the plurality of second emission layers may be arranged in a same way.

In certain embodiments, the first pixel electrode may be provided in a plurality. Wherein the second pixel electrode may be provided in a plurality. Wherein the plurality of first pixel electrodes may be arranged in a first arrangement. Wherein the plurality of second pixel electrodes may be arranged in a second arrangement different from the first arrangement.

In certain embodiments, the first sub-region and the second sub-region may be adjacent to each other in a first direction. Wherein each of the first and second pixels may include a plurality of first pixel emission regions, a plurality of second pixel emission regions, and a plurality of third pixel emission regions. Wherein the first pixel emission regions and the second pixel emission regions may be alternately arranged along a second direction intersecting the first direction. Wherein the second pixel emission regions and the third pixel emission regions may be alternately arranged along the second direction. Wherein the second pixel emission regions may be spaced apart in the first direction from the third pixel emission regions. Wherein the first pixel emission regions may be spaced apart in the first direction from the second pixel emission regions.

In certain embodiments, wherein two first pixel emission regions are on the first sub-region. Wherein four second pixel emission regions on the first sub-region. Wherein two third pixel emission regions are on the first sub-region. Wherein the first pixel emission regions may be light emitting regions of a red pixel. Wherein the second pixel emission regions may be light emitting regions of a green pixel. Wherein the third pixel emission regions may be light emitting regions of a blue pixel.

In certain embodiments, the first sub-region and the second sub-region may be adjacent to each other in a first direction. Wherein the first pixel electrode may be provided in a plurality. Wherein the second pixel electrode may be provided in a plurality. Wherein a first minimum distance between the plurality of first pixel electrodes that are spaced apart in the first direction may be greater than a second minimum distance between the plurality of second pixel electrodes that are spaced apart in the first direction.

In certain embodiments, a size of the first pixel electrode may be greater than a size of the second pixel electrode.

According to some example embodiments of the present inventive concept, a display device may comprise: a display panel on which are defined a first display region having a first resolution and a second display region having a second resolution less than the first resolution, the display panel including a plurality of first pixels on the first display region and a plurality of second pixels on the second display region; and an electronic module below the second display region. Wherein the second display region may include an emission region on which the second pixels are disposed and a transmission region on which the first and second pixels are not disposed. Wherein each of the first and second pixels may include a pixel electrode, an emission layer on the pixel electrode, and a common electrode on the emission layer. Wherein on the emission region, the emission layer may include an overlapping region where the emission layer overlaps the pixel electrode and a non-overlapping region where the emission layer does not overlap the pixel electrode. Wherein the non-overlapping region may be disposed between the overlapping region and the transmission region.

In certain embodiments, an area of the emission layer may be greater than an area of the pixel electrode.

In certain embodiments, each of the emission layer and the pixel electrode may have a quadrangular shape.

In certain embodiments, on the emission region, a center of the pixel electrode may be spaced apart from a center of the emission layer in a direction away from the transmission region.

In certain embodiments, the first display region and the second display region may be adjacent in a first direction. An imaginary line may not overlap a center of the pixel electrode on the emission region. The imaginary line may penetrate a center of the pixel electrode on the first display region and may extend in the first direction.

According to some example embodiments of the present inventive concept, a display device may comprise a display panel including a first display region having a first transmittance and a second display region having a second transmittance greater than the first transmittance. The second display region may be adjacent in a first direction to the first display region. The display panel may include a plurality of first pixels in the first display region; and a plurality of second pixels in the second display region. Each of the first and second pixels may include a pixel electrode, an emission layer on the pixel electrode, and a common electrode on the emission layer. A first minimum distance between the pixel electrodes of the first pixels may be greater than a second minimum distance between the pixel electrodes of the second pixels. Each of the first and second minimum distances may be a distance in a second direction intersecting the first direction.

DETAILED DESCRIPTION OF EMBODIMENTS

Figure 1A:
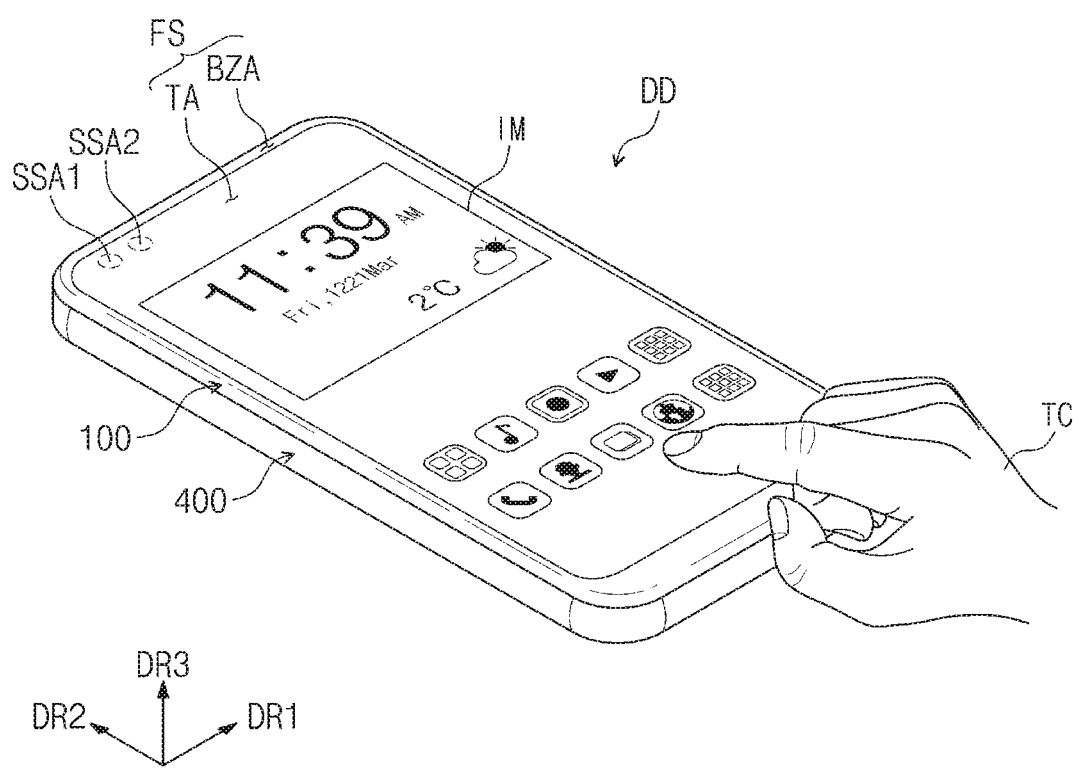
FIG. 1A illustrates a perspective view showing a display device according to embodiments of the present inventive concept.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Example embodiments are described with reference to the accompanying drawings, wherein like reference numerals may refer to like elements Moreover sizes of elements in the drawings may be exaggerated for convenience of explanation.

The term "and/or" includes one or more combinations defined by associated components.

Although the terms "first," "second," etc. may be used to describe various components, these components should not be limited by these terms. These terms are used to distinguish one component from another. A first component may be termed a second component without departing from teachings of one or more embodiments. The description of a component as a "first" component may not require or imply the presence of a second component or other components. The terms "first," "second," etc. may be used to differentiate different categories or sets of components. For conciseness, the terms "first," "second," etc. may represent "first-type (or first-set)," "second-type (or second-set)," etc., respectively.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe embodiments of the present inventive concept in conjunction with the accompanying drawings.

Figure 1B:
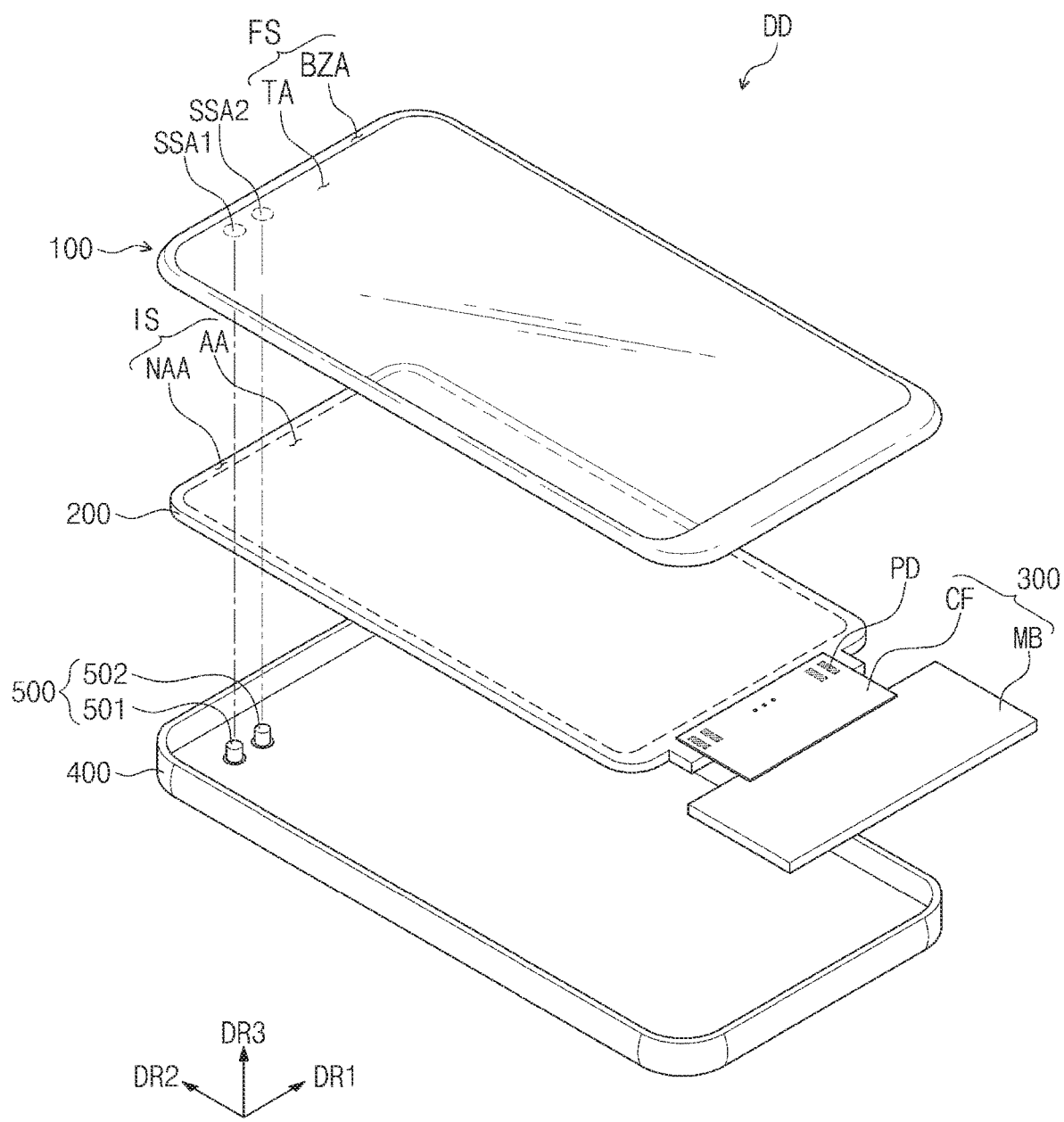
FIG. 1B illustrates an exploded perspective view showing a display device according to embodiments of the present inventive concept.
Figure 2:
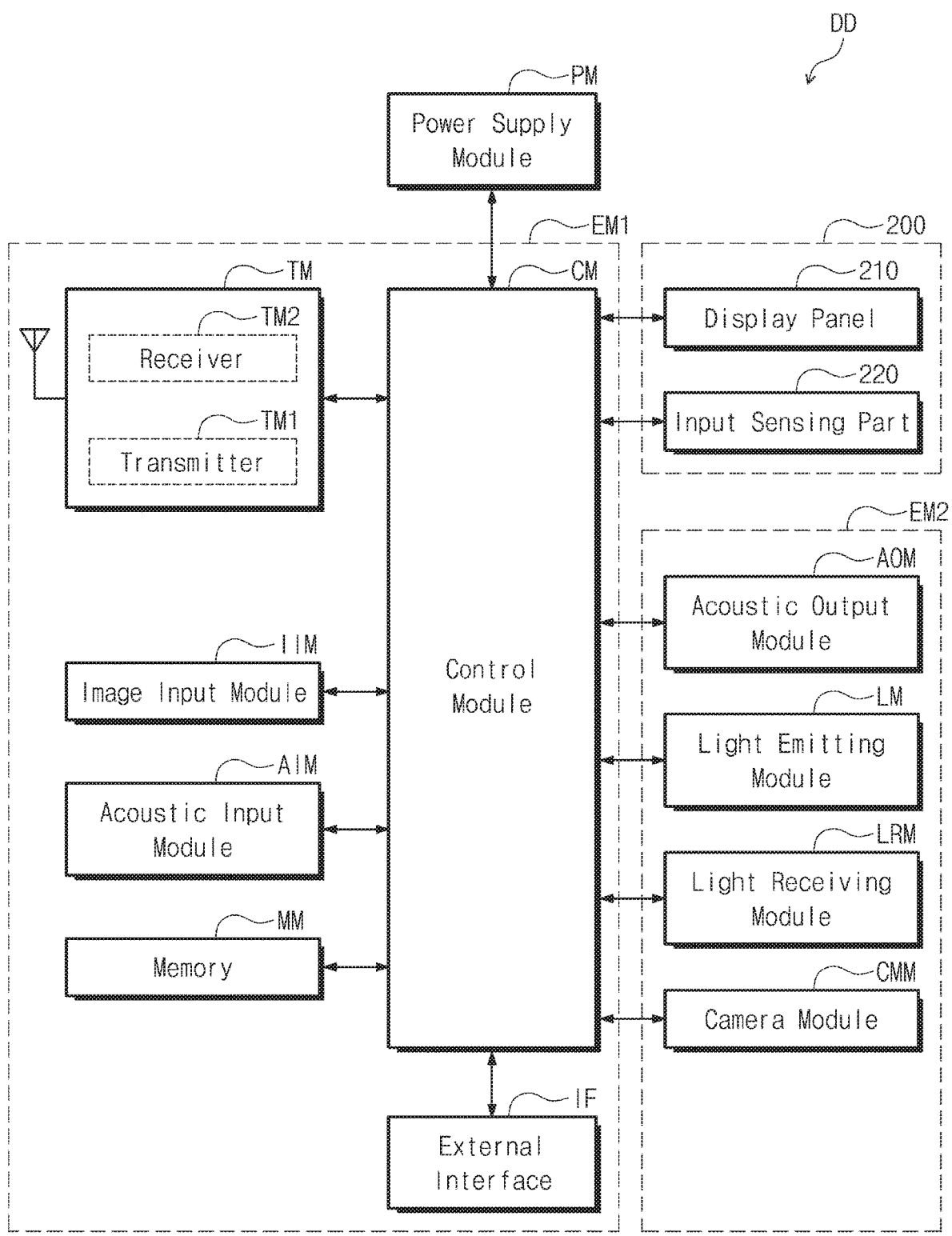
FIG. 2 illustrates a block diagram showing a display device according to embodiments of the present inventive concept.

FIG. 1A illustrates a perspective view showing a display device according to embodiments of the present inventive concept. FIG. 1B illustrates an exploded perspective view showing a display device according to embodiments of the present inventive concept. FIG. 2 illustrates a block diagram showing a display device according to embodiments of the present inventive concept. The present inventive concept will be explained below with reference to FIGS. 1A, 1B, and 2.

A display device DD may be an apparatus that is activated by electrical signals. Various embodiments of the display device DD may include, for example, a tablet computer, a laptop computer, or a television set. In an embodiment of the present inventive concept, a smart phone is illustrated, by way of example, as the display device DD.

The display device DD may display an image IM in a third direction DR3 on a display surface FS. The display surface FS is parallel to each of a first direction DR1 and a second direction DR2. The display surface FS on which the image IM is displayed may correspond to a front surface of the display device DD and to a front surface of a window 100. The same reference numeral is allocated to the display surface of the display device DD, the front surface of the display device DD, and the front surface of the window 100. The image IM may include not only a dynamic image but a static image. FIG. 1A shows a clock window and application icons as examples of the image IM.

In an embodiment, front and rear surfaces (or top and bottom surfaces) of each component are defined based on a direction along which the image IM is displayed. The front and rear surfaces may be opposite to each other in the third direction DR3, and a normal direction of each of the front and rear surfaces may be parallel to the third directions DR3. Directions indicated by the first, second, and third directions DR1, DR2, and DR3 are relative concepts and may denote other directions.

The display device DD may include a window 100, a display module 200, a drive circuit part 300, a housing 400, and electronic modules 500. In an embodiment, the window 100 and the housing 400 may be combined with each other to provide an appearance of the display device DD.

The window 100 may include an optically transparent dielectric material. For example, the window 100 may include glass or plastics. The window 100 may have a multi-layered structure or a single-layered structure. For example, the window 100 may include either a plurality of plastic films that are coupled through adhesives or a glass substrate coupled through an adhesive to a plastic film.

When viewed on a plane, the window 100 may be divided into a transmission region TA and a bezel region BZA. In this description, the phrase "when viewed on a plane" may mean when viewed in the third direction DR3. In addition, "a thickness direction" may denote the third direction DR3.

The transmission region TA may be an optically transparent zone. The bezel region BZA may be a zone whose transmittance is relatively less than that of the transmission region TA. The bezel region BZA may define a shape of the transmission region TA. The bezel region BZA may be adjacent to and surround the transmission region TA.

The bezel region BZA may have a certain color. The bezel region BZA may cover a peripheral area NAA of the display module 200 and may prevent the peripheral area NAA from being externally recognized, e.g., may prevent a user from seeing the peripheral area NAA. This configuration, however, is illustrated by way of example, and the bezel region BZA may be omitted in the window 100 according to other embodiments of the present inventive concept.

In an embodiment, sensing regions SSA1 and SSA2 may be zones that overlap the electronic modules 500 which will be discussed below. The display device DD may receive through the sensing regions SSA1 and SSA2 external signals required for the electronic modules 500, or may provide signals output from the electronic modules 500 to the outside. According to the present inventive concept, the sensing regions SSA1 and SSA2 may be defined to overlap the transmission region TA. Therefore, on a region other than the transmission region TA, it may be possible to omit a separate zone on which the sensing regions SSA1 and SSA2 are provided. As a result, the bezel region BZA may decrease in area.

FIG. 1B depicts by way of example two sensing regions SSA1 and SSA2, but the present inventive concept is not limited to such an arrangement. For example, three or more sensing regions SSA1 and SSA2 may be defined, or one of the sensing regions SSA1 and SSA2 may be omitted to define a single sensing region. FIG. 1B depicts by way of example shows that the sensing regions SSA1 and SSA2 are defined on a left top portion of the transmission region TA, but the sensing regions SSA1 and SSA2 may be defined on a right top portion, a central portion, a left bottom portion, a right bottom portion, or any other portion of the transmission region TA. Alternatively, one of the sensing regions SSA1 and SSA2 may be defined on the left top portion of the transmission region TA, and the other of the sensing regions SSA1 and SSA2 may be defined on the right top portion of the transmission region TA.

The display module 200 may be disposed below the window 100. In this description, the term "below" may mean a direction opposite to a direction along which the display module 200 provides an image. The display module 200 may display the image IM and may detect an external input TC. The display module 200 includes a front surface IS having an active area AA and a peripheral area NAA. The active area AA may be a zone that is activated by electrical signals.

In an embodiment, the active area AA may be a zone on which the image IM is displayed, and may also be a zone on which the external input TC is detected. The transmission region TA overlaps at least the active area AA. For example, the transmission region TA overlaps a front surface or at least a portion of the active area AA, or may overlap an entirety of the active area AA. Accordingly, in any case, a user may recognize the image IM through the transmission region TA, or may provide the external input TC through the transmission region TA.

The peripheral area NAA may be a zone covered with the bezel region BZA. The peripheral area NAA is adjacent to the active area AA. The peripheral area NAA may surround the active area AA. The peripheral area NAA may be provided thereon with a drive line or a drive circuit for driving the active area AA.

In an embodiment, the display module 200 is assembled such that the active area AA and the peripheral area NAA are in a flat state facing the window 100. This configuration, however, is illustrated by way of example, and a portion of the peripheral area NAA may be bent. In this case, the bent portion of the peripheral area NAA may be directed toward a rear surface of the display device DD, and thus the bezel region BZA may have a reduced area on the front surface of the display device DD. Alternatively, the display module 200 may be assembled such that a portion of the active area AA is also in a bending state. Dissimilarly, the peripheral area NAA may be omitted from the display module 200 according to embodiments of the present inventive concept.

The drive circuit part 300 may be electrically connected to the display module 200. The drive circuit part 300 may include a main circuit board MB and a flexible film CF.

The flexible film CF is electrically connected to the display module 200. The flexible film CF may be coupled to pads PD of the display module 200 that are disposed on the peripheral area NAA. The flexible film CF provides the display module 200 with electrical signals for driving the display module 200. The electrical signals may be generated either from the flexible film CF or from the main circuit board MB. The main circuit board MB may include connectors for supplying power or various drive circuits for driving the display module 200.

In an embodiment, on the display module 200, a zone corresponding to the sensing regions SSA1 and SSA2 may have greater transmittance than the active area AA. The active area AA does not overlap the sensing regions SSA1 and SSA2. For example, at least one among components of the display module 200 may be removed. Accordingly, the electronic modules 500 may easily transfer and/or receive signals through the sensing regions SSA1 and SSA2.

The electronic modules 500 may include a first electronic module 501 and a second electronic module 502. When viewed on a plane, the first and second electronic modules 501 and 502 may overlap the sensing regions SSA1 and SSA2. The first and second electronic modules 501 and 502 may be disposed below the display module 200. The first and second electronic modules 501 and 502 may receive external inputs that are transferred through the sensing regions SSA1 and SSA2 or may provide outputs through the sensing regions SSA1 and SSA2.

The housing 400 may be combined with the window 100. The housing 400 and the window 100 may be combined with each other to provide an inner space. The inner space may accommodate the display module 200 and the electronic modules 500.

The housing 400 may include a material whose rigidity is relatively high. For example, the housing 400 may include one of glass, plastics, and metal, or may include a plurality of frames or plates consisting of any combination of glass, plastics, and metal. The housing 400 may stably protect, from external impact, components of the display device DD that are accommodated in the inner space.

Referring to FIG. 2, the display device DD may include a display module 200, a power supply module PM, a first electronic module EM1, and a second electronic module EM2. The display module 200, the power supply module PM, the first electronic module EM1, and the second electronic module EM2 may be electrically connected to each other.

The display module 200 may include a display panel 210 and an input sensor 220.

The display panel 210 may be configured to substantially generate the image IM. The image IM generated from the display panel 210 may be displayed on the front surface IS, and a user may externally recognize the image IM through the transmission region TA.

The input sensor 220 may detect the external input TC that is externally applied. For example, the input sensor 220 may detect the external input TC provided to the window 100. The external input TC may be a user's input. The user's input includes a user's body, light, heat, pressure, or various types of inputs. For example, the external input TC may be a user's hand or finger applied to the front surface FS. This, however, is only an example, and the external input TC may be provided in various types as discussed above. Depending on a structure of the display device DD, the display device DD may detect the external input TC that is applied to a lateral or rear surface of the display device DD.

The power supply module PM supplies power required for overall operation of the display device DD. The power supply module PM may include a battery module that is ordinarily used.

The first electronic module EM1 and the second electronic module EM2 may include diverse functional modules for operating the display device DD.

The first electronic module EM1 may be directly mounted on a motherboard electrically connected to the display module 200, or may be mounted on a separate board electrically connected to a motherboard through connectors (not shown) or the like.

The first electronic module EM1 may include a control module CM, a wireless communication module TM, an image input module IIM, an acoustic(audio) input module AIM, a memory MM, and an external interface IF. One or more of the modules mentioned above may not be mounted on a motherboard, but may be electrically connected to a motherboard through a flexible circuit board.

The control module CM controls overall operation of the display device DD. The control module CM may be a microprocessor. For example, the control module CM may activate or deactivate the display module 200. Based on touch signals received from the display module 200, the control module CM may control other modules such as the image input module IIM and the acoustic input module AIM.

The wireless communication module TM may use Bluetooth and/or WiFi communication systems to transceive wireless signals with other terminals. The wireless communication module TM may use a general communication system to transceive speech signals. The wireless communication module TM may include a transmitter TM1 that modulates and transmits signals to be transferred, and also include a receiver TM2 that demodulates received signals.

The image input module IIM processes and converts image signals into image data for display on the display module 200. In record mode or speech recognition mode, the acoustic input module AIM receives external sound signals through a microphone, and converts the received sound signals into electrical voice data.

The external interface IF may serve as an interface connected to an external charger, a wire/wireless data port, and/or a card socket (e.g., memory card, SIM/UIM card).

The second electronic module EM2 may include an acoustic (audio) output module AOM, a light emitting module LM, a light receiving module LRM, and a camera module CMM. These components may be directly mounted on a motherboard, may be mounted on a separate board and electrically connected through connectors (not shown) or the like to the display module 200, or may be electrically connected to the first electronic module EM1.

The acoustic output module AOM converts and outputs sound data received from the wireless communication module TM or stored in the memory MM.

The light emitting module LM generates and outputs light. The light emitting module LM may output an infrared ray. The light emitting module LM may include a light emitting diode (LED) element. The light receiving module LRM may detect an infrared ray. The light receiving module LRM may be activated when detecting an infrared ray at a certain level or higher. The light receiving module LRM may include a complementary metal oxide semiconductor (CMOS) sensor. After the output of an infrared ray generated from the light emitting module LM, the infrared ray may be reflected from an external substance (e.g., user's fingers or face), and then the reflected infrared ray may be incident on the light receiving module LRM. The camera module CMM may capture an external image.

Each of the first and second electronic modules 501 and 502 according to embodiments of the present inventive concept may include one or more of components included in the first electronic module EM1 and the second electronic module EM2. For example, each of the first and second electronic modules 501 and 502 may include one or more of the acoustic output modules AOM, the light emitting module LM, the light receiving module LRM, the camera module CMM, and a heat sensing module. The first and second electronic modules 501 and 502 may detect an external subject that is received through the sensing regions SSA1 and SSA2 or may externally provide sound signals, such as speech, or light, such as an infrared ray, through the sensing regions SSA1 and SSA2.

Figure 3A:
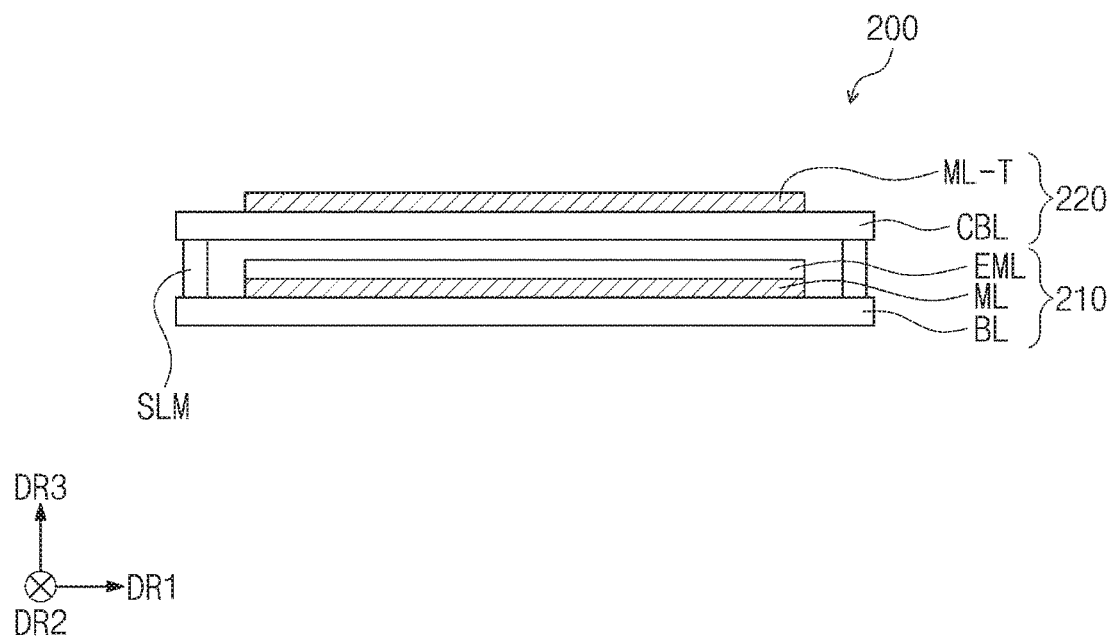
FIG. 3A illustrates a cross-sectional view showing a display module according to embodiments of the present inventive concept.

FIG. 3A illustrates a cross-sectional view showing a display module according to embodiments of the present inventive concept.

Referring to FIG. 3A, a display module 200 may include a display panel 210, an input sensor 220, and a coupling member SLM. The input sensor 220 may be called an input sensing panel.

The display panel 210 according to embodiments of the present inventive concept may be an emissive display panel. However, the present inventive concept is not limited thereto, and, for example, the display panel 210 may be an organic light emitting display panel or a quantum dot light emitting display panel.

The display panel 210 may include a base layer BL, a display circuit layer ML, and a light emitting element layer EML. The input sensor 220 may include a cover substrate CBL and a sensing circuit layer ML-T.

Each of the base layer BL and the cover substrate CBL may be a silicon substrate, a plastic substrate, a glass substrate, a dielectric film, or a stack structure including a plurality of dielectric layers.

The display circuit layer ML may be disposed on the base layer BL. The display circuit layer ML may include a plurality of dielectric layers, a plurality of conductive layers, and a semiconductor layer. The plurality of conductive layers included in the display circuit layer ML may constitute signal lines or a pixel control circuit.

The light emitting element layer EML may be disposed on the display circuit layer ML. The light emitting element layer EML may include an emission layer that generates light. For example, when the display panel 210 is an organic light emitting display panel, the emission layer may include an organic light emitting material. For another example, when the display panel 210 is a quantum dot light emitting display panel, the emission layer may include one or more of a quantum dot and a quantum rod.

The cover substrate CBL may be disposed on the light emitting element layer EML. A certain space may be defined between the cover substrate CBL and the light emitting element layer EML. The space may be filled with air or an inert gas. In an embodiment, the space may be filled with a filler such as silicone-based polymer, epoxy-based resin, or acryl-based resin.

The sensing circuit layer ML-T may be disposed on the cover substrate CBL. The sensing circuit layer ML-T may include a plurality of dielectric layers and a plurality of conductive layers. The plurality of conductive layers may constitute a sensing electrode that detects an external input, a sensing line connected to the sensing electrode, and a sensing pad connected to the sensing line.

The coupling member SLM may be disposed between the base layer BL and the cover substrate CBL. The coupling member SLM may couple the base layer BL to the cover substrate CBL. The coupling member SLM may include an organic material such as photo-curable resin or photo-plastic resin, or an inorganic material such as frit seal.

Figure 3B:
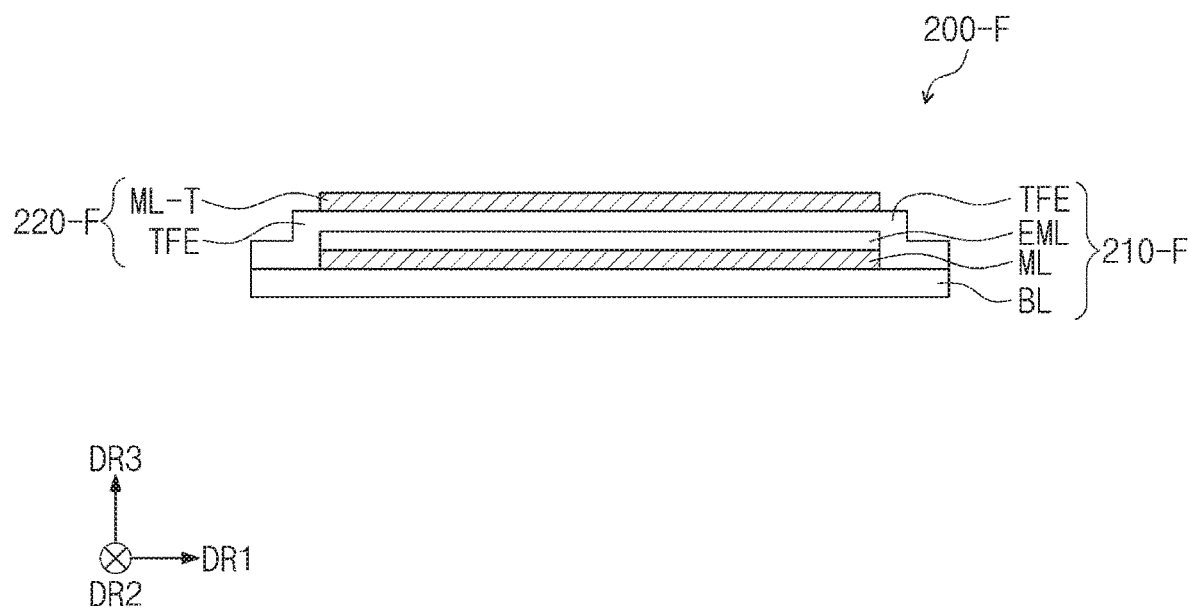
FIG. 3B illustrates a cross-sectional view showing a display device according to embodiments of the present inventive concept.

FIG. 3B illustrates a cross-sectional view showing a display device according to embodiments of the present inventive concept.

Referring to FIG. 3B, a display module 200-F may include a display panel 210-F and an input sensor 220-F. The input sensor 220-F may be called an input sensing layer.

The display panel 210-F may include a base layer BL, a display circuit layer ML, a light emitting element layer EML, and a thin encapsulation layer TFE. The input sensor 220-F may include a base layer TFE and a sensing circuit layer ML-T. The thin encapsulation layer TFE and the base layer TFE may be the same component.

According to embodiments of the present inventive concept, the display panel 210-F and the input sensor 220-F may be formed in a successive process. For example, the sensing circuit layer ML-T may be directly formed on the thin encapsulation layer (or the base layer) TFE.

Figure 4A:
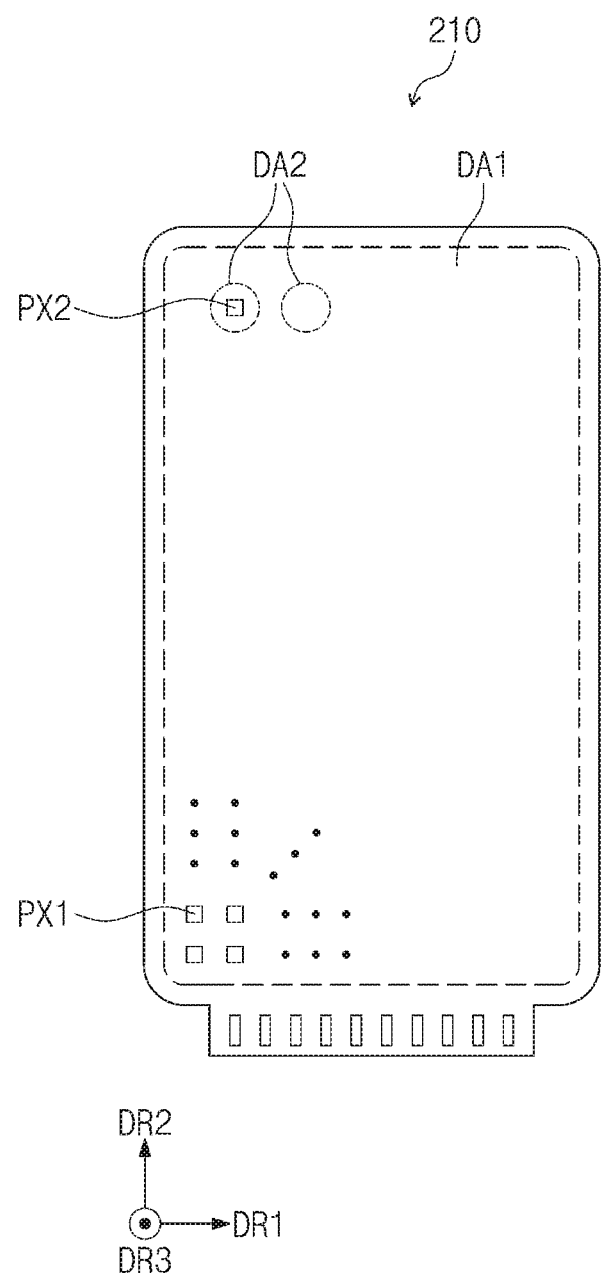
FIG. 4A illustrates a plan view showing a display panel according to embodiments of the present inventive concept

FIG. 4A illustrates a plan view showing a display panel according to embodiments of the present inventive concept.

Referring to FIG. 4A, a first display region DA1 and a second display region DA2 may be defined on a display panel 210. The first display region DA1 and the second display region DA2 may correspond to the active area (see AA of FIG. 1B) of the display module (see 200 of FIG. 1B).

The electronic modules (see 500 of FIG. 1B) may be disposed below the second display region DA2. The second display region DA2 may have transmittance greater than that of the first display region DA1. Therefore, the electronic modules 500 may easily transmit and/or receive signals through the second display region DA2. One or more components of the second display region DA2 may be omitted to increase transmittance of the second display region DA2. For example, one or more pixels may be removed from the second display region DA2.

In an embodiment, the second display region DA2 may be provided on a location that corresponds to that of the sensing regions (see SSA1 and SSA2 of FIG. 1A). For example, when two sensing regions SSA1 and SSA2 are provided, two second display regions DA2 (referred to hereinafter as second display regions) may be provided. The second display regions DA2 may be spaced apart from each other. Each of the second display regions DA2 may be surrounded by the first display region DA1.

First pixels PX1 may be disposed in the first display region DA1, and second pixels PX2 may be disposed in the second display region DA2. The first pixels PX1 and the second pixels PX2 may generate light. The number of the first pixels PX1 on a certain zone may be different from that of the second pixels PX2 on another zone whose area is the same as that of the certain zone, e.g., the density of second pixels PX2 may be less than the density of the first pixels PX1. For example, the number of the second pixels PX2 may be less than that of the first pixels PX1. Therefore, the second display region DA2 may have transmittance greater than that of the first display region DA1. In addition, the second display region DA2 may have resolution less than that of the first display region DA1.

Figure 4B:
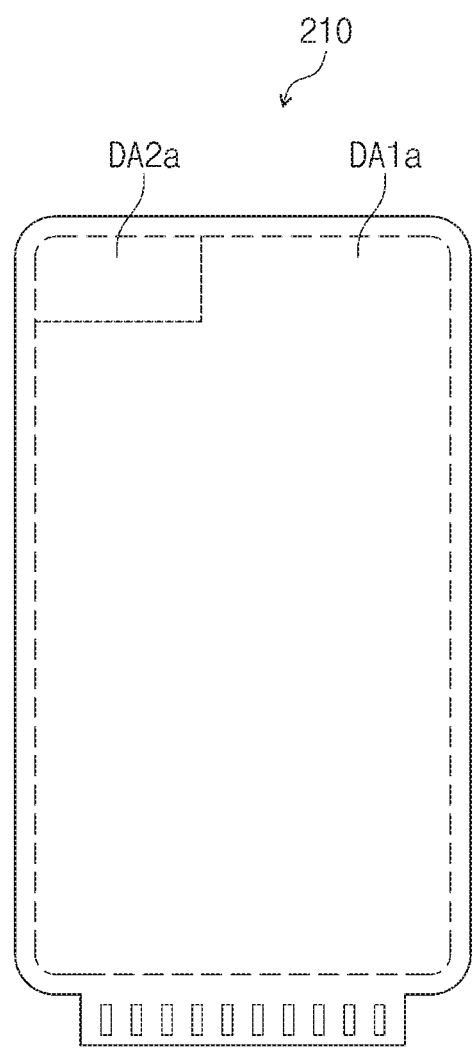
FIG. 4B illustrates a plan view showing a display panel according to embodiments of the present inventive concept.

FIG. 4B illustrates a plan view showing a display panel according to embodiments of the present inventive concept. In explanation of FIG. 4B, similar reference symbols are allocated to the components discussed with reference to FIG. 4A, and a description thereof will be omitted.

Referring to FIG. 4B, a first display region DA1$a$ and a second display region DA2$a$ may be defined on the display panel 210.

The electronic modules (see 500 of FIG. 1B) may be disposed below the second display region DA2$a$. When viewed on a plane, the second display region DA2$a$ may overlap the sensing regions (see SSA1 and SSA2 of FIG. 1A). The second display region DA2$a$ may have an area greater than those of the sensing regions SSA1 and SSA2.

FIG. 4B depicts by way of example that the second display region DA2$a$ is defined on a left corner of the display panel 210, but the position of the second display region DA2$a$ may be changed depending on positions of the electronic modules 500. For example, in an embodiment, the second display region DA2$a$ may be defined on a right corner of the display panel 210. In another embodiment, the second display region DA2$a$ may be defined on both of the left and right corners of the display panel 210.

Figure 4C:
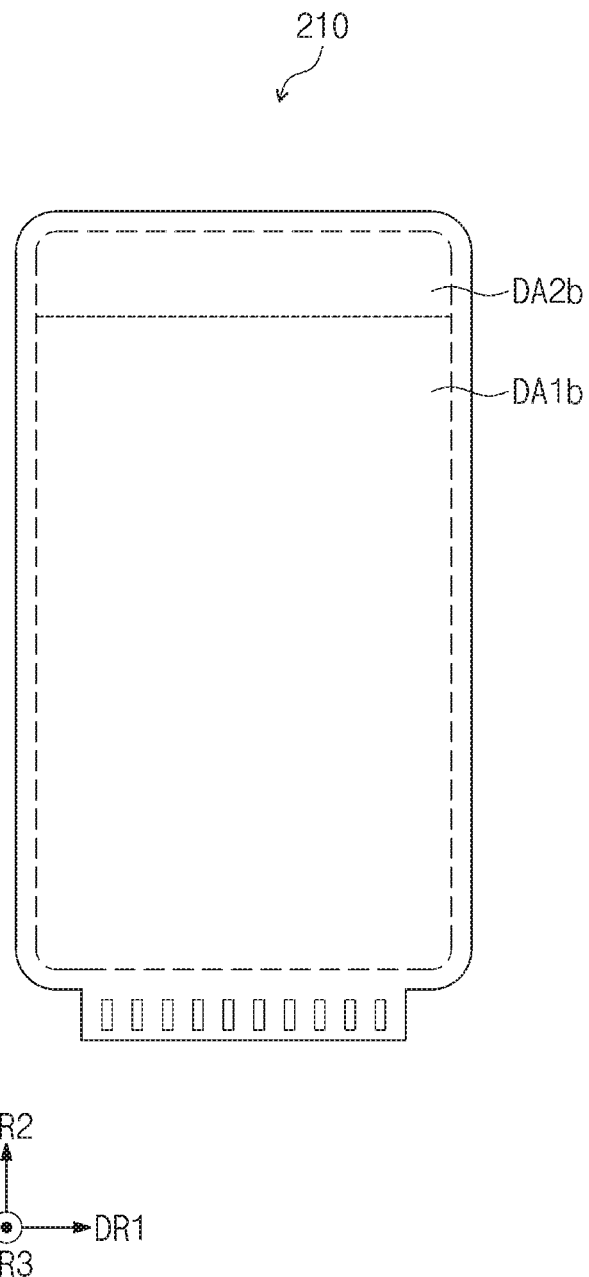
FIG. 4C illustrates a plan view showing a display panel according to embodiments of the present inventive concept.

FIG. 4C illustrates a plan view showing a display panel according to embodiments of the present inventive concept. In explanation of FIG. 4C, similar reference symbols are allocated to the components discussed with reference to FIG. 4A, and a description thereof will be omitted.

Referring to FIG. 4C, a first display region DA1$b$ and a second display region DA2$b$ may be defined on the display panel 210.

The electronic modules (see 500 of FIG. 1B) may be disposed below the second display region DA2$b$. When viewed on a plane, the second display region DA2$b$ may overlap the sensing regions (see SSA1 and SSA2 of FIG. 1A). The second display region DA2$b$ may have an area greater than those of the sensing regions SSA1 and SSA2.

The first display region DA1$b$ and the second display region DA2$b$ may be adjacent to each other in the second direction DR2. The first display region DA1$b$ and the second display region DA2$b$ may have therebetween a boundary that extends in the first direction DR1.

When viewed on a plane, the second display region DA2$b$ may be defined on an upper portion of the display panel 210. Because the second display region DA2$b$ has an area greater than that of the second display region DA2 discussed above in FIG. 4A and that of the second display region DA2$a$ discussed above in FIG. 4B, the electronic modules 500 may increase in the degree of freedom of position change.

Figure 5A:
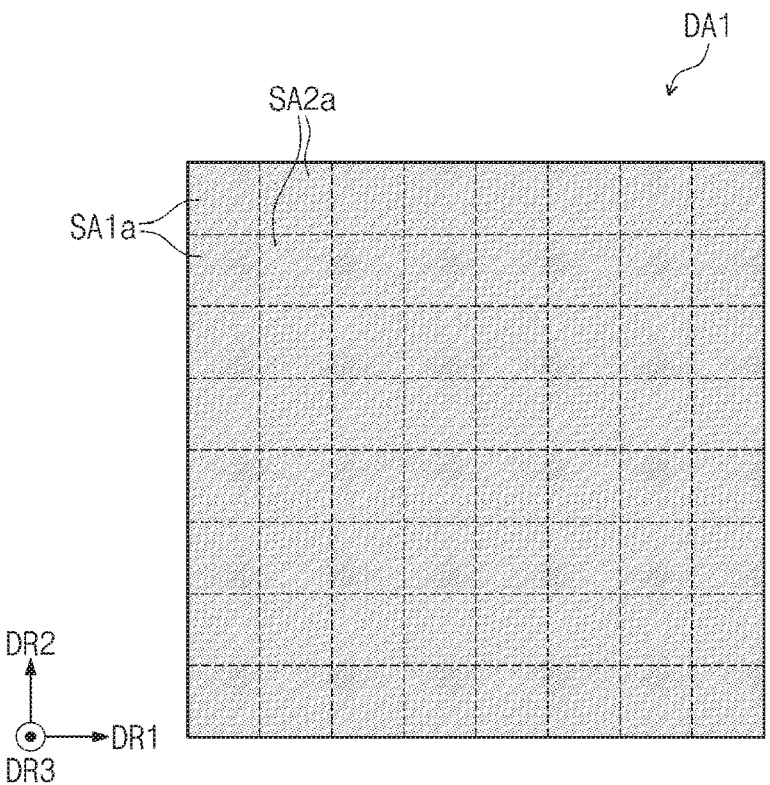
FIG. 5A illustrates an enlarged plan view partially showing a display panel according to embodiments of the present inventive concept.

FIG. 5A illustrates an enlarged plan view partially showing a display panel according to embodiments of the present inventive concept. To be specific, FIG. 5A may be an enlarged plan view illustrating the first display region DA1 of the display panel (see 210 of FIG. 4A).

Referring to FIG. 5A, the first display region DA1 may include a plurality of sub-light emitting regions SA1$a$ and SA2$a$. The plurality of sub-light emitting regions SA1$a$ and SA2$a$ may include first sub-light emitting regions SA1$a$ and second sub-light emitting regions SA2$a$.

The first sub-light emitting regions SA1$a$ may be arranged along the second direction DR2. The second sub-light emitting regions SA2a may be arranged along the second direction DR2. The first sub-light emitting regions SA1a and the second sub-light emitting regions SA2a may be alternately arranged in the first direction DR1. Pixels disposed on the first sub-light emitting regions SA1a may be different from those disposed on the second sub-light emitting regions SA2a. This will be further discussed below.

Figure 5B:
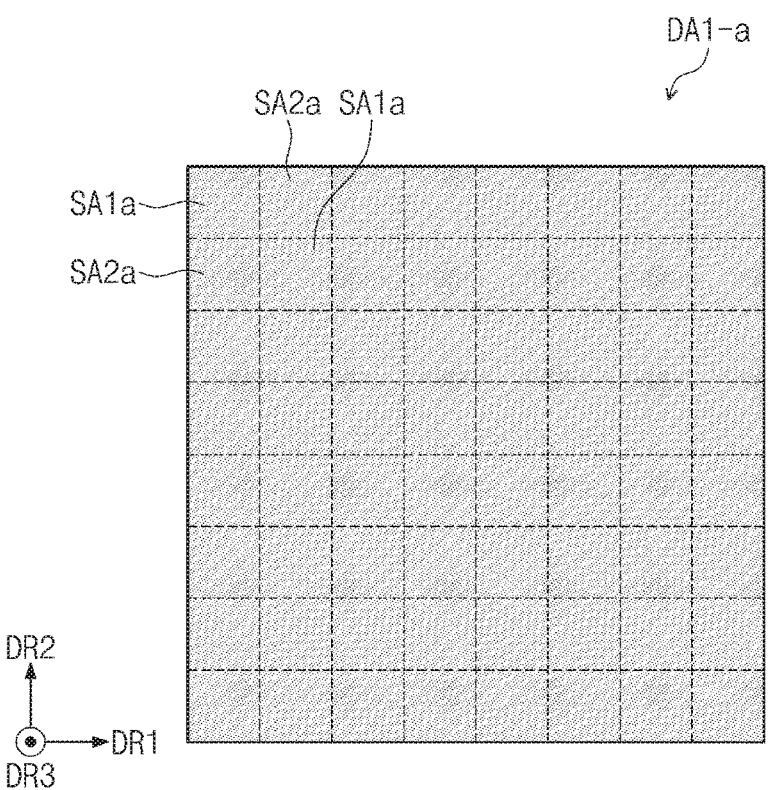
FIG. 5B illustrates an enlarged plan view partially showing a display panel according to embodiments of the present inventive concept.

FIG. 5B illustrates an enlarged plan view partially showing a display panel according to embodiments of the present inventive concept. To be specific, FIG. 5B may be an enlarged plan view illustrating a first display region DA1-a as an example of the first display region DA1 of the display panel (see 210 of FIG. 4A).

Referring to FIG. 5B, the first display region DA1-a may include a plurality of sub-light emitting regions SA1a and SA2a. The plurality of sub-light emitting regions SA1a and SA2a may include first sub-light emitting regions SA1a and second sub-light emitting regions SA2a.

The first sub-light emitting regions SA1a and the second sub-light emitting regions SA2a may be alternately arranged in the first direction DR1. In addition, the first sub-light emitting regions SA1a and the second sub-light emitting regions SA2a may be alternately arranged in the second direction DR2. For example, one first sub-light emitting region SA1a and one second sub-light emitting region SA2a may be repeatedly and alternately arranged in the first and second directions DR1 and DR2.

Pixels disposed in the first sub-light emitting regions SA1a may be different from those disposed in the second sub-light emitting regions SA2a. This will be further discussed below.

Figure 6A:
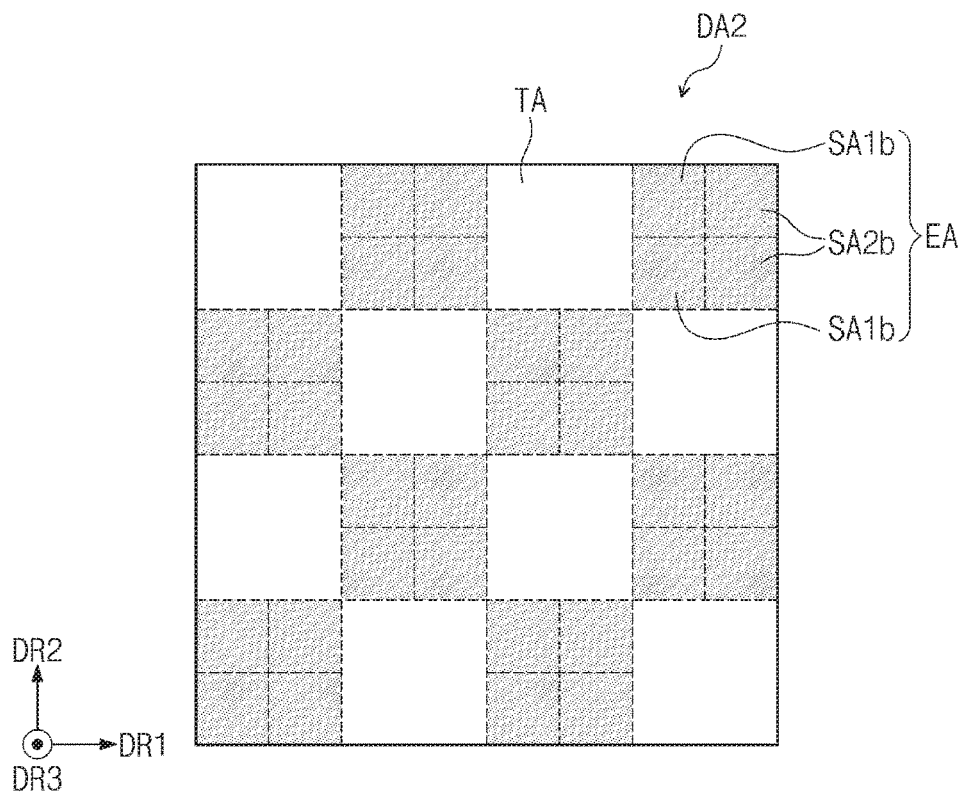
FIG. 6A illustrates an enlarged plan view partially showing a display panel according to embodiments of the present inventive concept.

FIG. 6A illustrates an enlarged plan view partially showing a display panel according to embodiments of the present inventive concept. To be specific, FIG. 6A may be an enlarged plan view illustrating the second display region DA2 of the display panel (see 210 of FIG. 4A). In addition, FIG. 6A shows the second display region DA2 whose area is the same as that of the first display region DA1 illustrated in FIG. 5A. The following description may also be applicable to the second display regions DA2a and DA2b discussed in FIGS. 4B and 4C.

Referring to FIG. 6A, the second display region DA2 may include emission regions EA and transmission regions TA.

The emission regions EA and the transmission regions TA may be alternately arranged along the first direction DR1 and also along the second direction DR2. Therefore, one emission region EA may be adjacent to one or more transmission regions TA.

Each of the emission regions EA may include a plurality of sub-light emitting regions SA1b and SA2b. The plurality of sub-light emitting regions SA1b and SA2b may include first sub-light emitting regions SA1b and second sub-light emitting regions SA2b. In an embodiment, each of the emission regions EA may include two first sub-light emitting regions SA1b and two second sub-light emitting regions SA2b.

The first sub-light emitting regions SA1b may be arranged along the second direction DR2. The second sub-light emitting regions SA2b may be arranged along the second direction DR2. The first sub-light emitting regions SA1b and the second sub-light emitting regions SA2b may be alternately arranged in the first direction DR1. Pixels disposed on the first sub-light emitting regions SA1b may be different from those disposed on the second sub-light emitting regions SA2b. This will be further discussed below.

No pixels may be disposed in the transmission regions TA. Therefore, the transmission regions TA may have transmittance greater than that of the emission regions EA. No component of a pixel may be disposed in the transmission regions TA, or one or more of components of a pixel may not be disposed in the transmission regions TA, e.g. at least some portion of a pixel may not be disposed in the transmission regions TA, including, in some embodiments, the whole pixel. In addition, in an embodiment, one or more of components of the display panel 210 may be omitted to increase transmittance of the transmission regions TA.

Figure 6B:
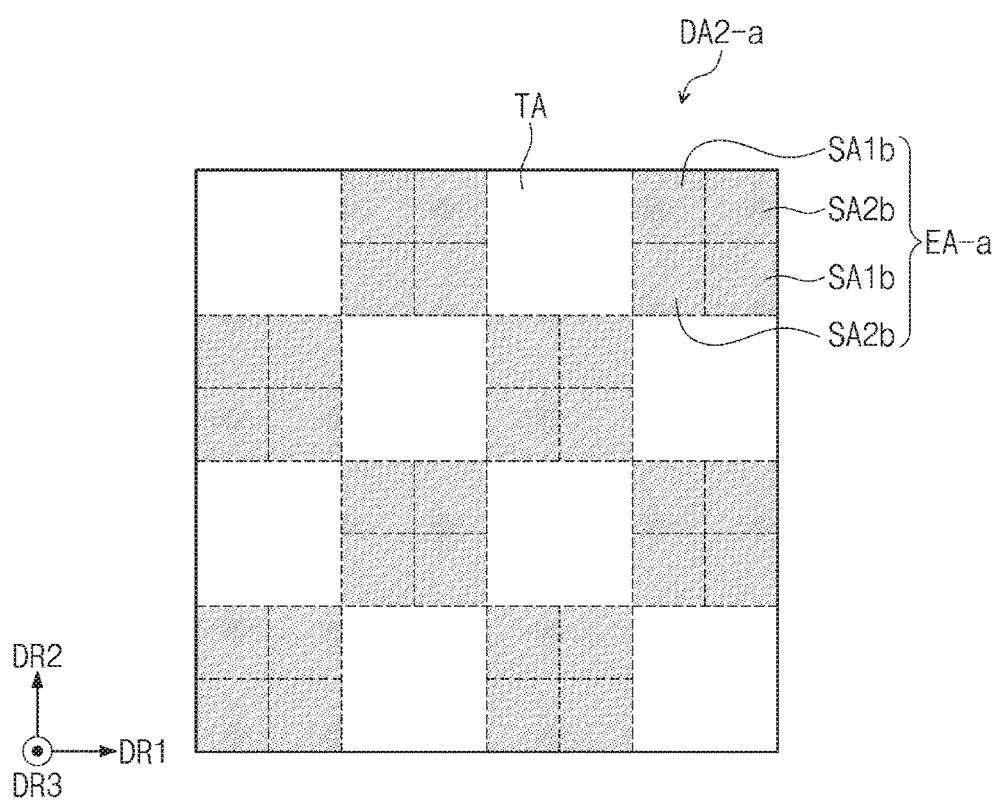
FIG. 6B illustrates an enlarged plan view partially showing a display panel according to embodiments of the present inventive concept.

FIG. 6B illustrates an enlarged plan view partially showing a display panel according to embodiments of the present inventive concept. To be specific, FIG. 6B may be an enlarged plan view illustrating a second display region DA2-a as an example of the second display region DA2 of the display panel (see 210 of FIG. 4A). In addition, FIG. 6B shows the second display region DA2-a whose area is the same as that of the first display region DA1-a illustrated in FIG. 5B. The following description may also be applicable to the second display regions DA2a and DA2b discussed in FIGS. 4B and 4C.

Referring to FIG. 6B, the second display region DA2-a may include transmission regions TA and emission regions EA-a.

Each of the emission regions EA-a may include a plurality of sub-light emitting regions SA1b and SA2b. The plurality of sub-light emitting regions SA1b and SA2b may include first sub-light emitting regions SA1b and second sub-light emitting regions SA2b. In an embodiment, each of the emission regions EA-a may include two first sub-light emitting regions SA1b and two second sub-light emitting regions SA2b.

The first sub-light emitting regions SA1b and the second sub-light emitting regions SA2b may be alternately arranged in the first direction DR1. In addition, the first sub-light emitting regions SA1b and the second sub-light emitting regions SA2b may be alternately arranged in the second direction DR2. For example, one first sub-light emitting region SA1b and one second sub-light emitting region SA2b may be repeatedly and alternately arranged in the first and second directions DR1 and DR2.

Pixels disposed on the first sub-light emitting regions SA1b may be different from those disposed on the second sub-light emitting regions SA2b. This will be further discussed below.

Figure 7:
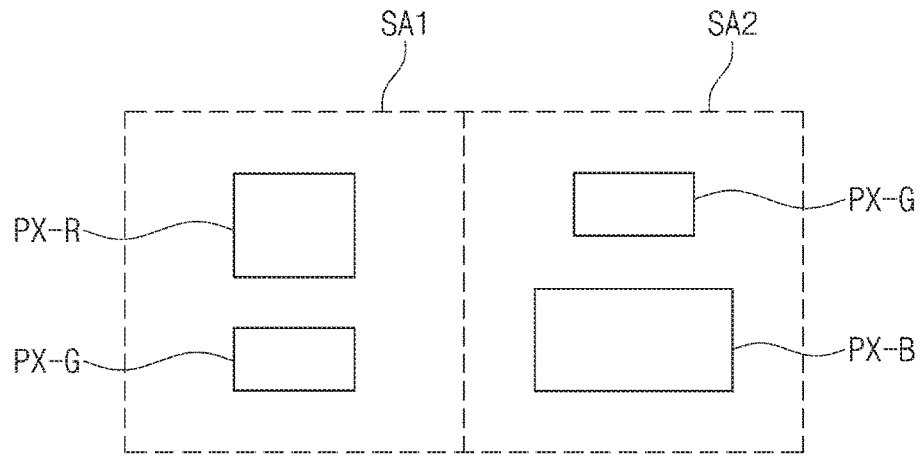
FIG. 7 illustrates an enlarged plan view showing the configuration of a display panel according to embodiments of the present inventive concept.

FIG. 7 illustrates an enlarged plan view showing the configuration of a display panel according to embodiments of the present inventive concept.

FIG. 7 illustrates a first sub-light emitting region SA1 and a second sub-light emitting region SA2.

Each of the first and second pixels PX1 and PX2 may include a first sub-pixel, a second sub-pixel, and a third sub-pixel. The first sub-pixel may include a first pixel emission region PX-R, the second sub-pixel may include a second pixel emission region PX-G, and the third sub-pixel may include a third pixel emission region PX-B. The first pixel emission region PX-R may be a light emitting region of a red pixel, second pixel emission region PX-G may be a light emitting region of a green pixel, and the third pixel emission region PX-B may be a light emitting region of a blue pixel.

The first pixel emission region PX-R and the second pixel emission region PX-G may be disposed in the first sub-light emitting region SA1. The second pixel emission region PX-G and the third pixel emission region PX-B may be disposed in the second sub-light emitting region SA2.

The first pixel emission region PX-R and the second pixel emission region PX-G may be alternately arranged along the second direction DR2, and the second pixel emission region PX-G and the third pixel emission region PX-B may be alternately arranged along the second direction DR2.

The second pixel emission region PX-G disposed on the first sub-light emitting region SA1 may be spaced apart in the first direction DR1 from the third pixel emission region PX-B. The second pixel emission region PX-G disposed on the second sub-light emitting region SA2 may be spaced apart in the first direction DR1 from the first pixel emission region PX-R.

Each of the first sub-light emitting region SA1*a* of FIG. 5A and the first sub-light emitting region SA1*b* of FIG. 6A may include sub-pixels identical to those disposed on the first sub-light emitting region SAL Each of the second sub-light emitting region SA2*a* of FIG. 5A and the second sub-light emitting region SA2*b* of FIG. 6A may include sub-pixels identical to those disposed on the second sub-light emitting region SA2.

FIG. 7 depicts by way of example each of the first, second, and third pixel emission regions PX-R, PX-G, and PX-B having a quadrangular shape, but the present inventive concept is not limited to such configuration. For example, in an embodiment, one or more of the first, second, and third pixel emission regions PX-R, PX-G, and PX-B may have a polygonal shape, such as a hexagonal shape. At least some of the first, second, and third pixel emission regions PX-R, PX-G, and PX-B may have different shapes from each other. For example, each of the first and third pixel emission regions PX-R and PX-B may have a quadrangular shape, and the second pixel emission region PX-G may have a hexagonal shape.

Figure 8:
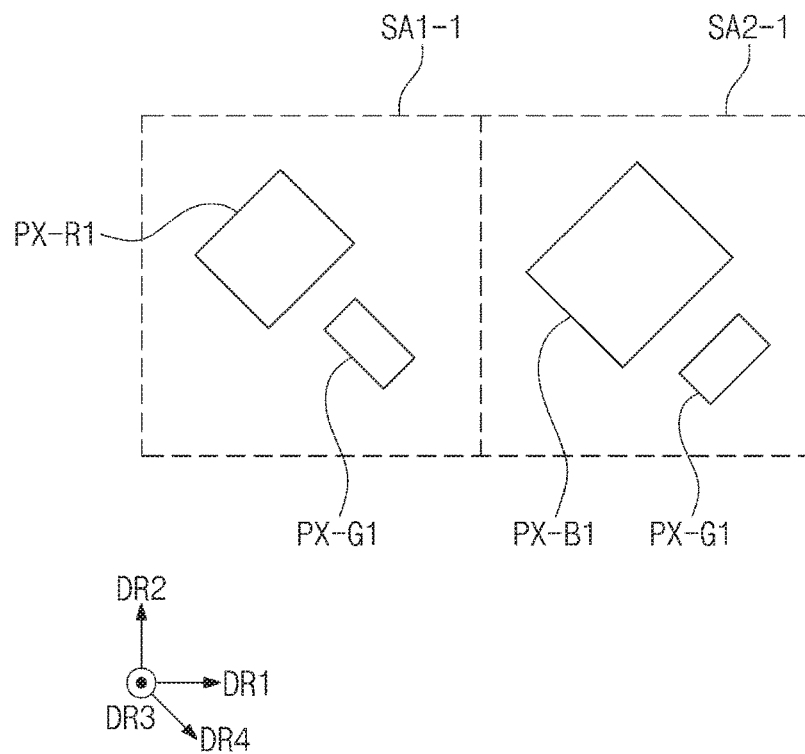
FIG. 8 illustrates an enlarged plan view showing the configuration of a display panel according to embodiments of the present inventive concept.

FIG. 8 illustrates an enlarged plan view showing the configuration of a display panel according to embodiments of the present inventive concept.

FIG. 8 illustrates a first sub-light emitting region SA1-1 and a second sub-light emitting region SA2-1.

A first pixel emission region PX-R1 and a second pixel emission region PX-G1 may be disposed in the first sub-light emitting region SA1-1. A second pixel emission region PX-G1 and a third pixel emission region PX-B1 may be disposed in the second sub-light emitting region SA2-1.

The first pixel emission region PX-R1 may be spaced apart in the first direction DR1 from the third pixel emission region PX-B1. The second pixel emission region PX-G1 disposed in the first sub-light emitting region SA1-1 may be spaced apart in the first direction DR1 from the second pixel emission region PX-G1 disposed in the second sub-light emitting region SA2-1.

On the first sub-light emitting region SA1-1, the second pixel emission region PX-G1 may be spaced apart in a fourth direction DR4 from the first pixel emission region PX-R1. The fourth direction DR4 may intersect the first and second directions DR1 and DR2. On the second sub-light emitting region SA2-1, the second pixel emission region PX-G1 may be spaced apart in the fourth direction DR4 from the third pixel emission region PX-B1.

Figure 9:
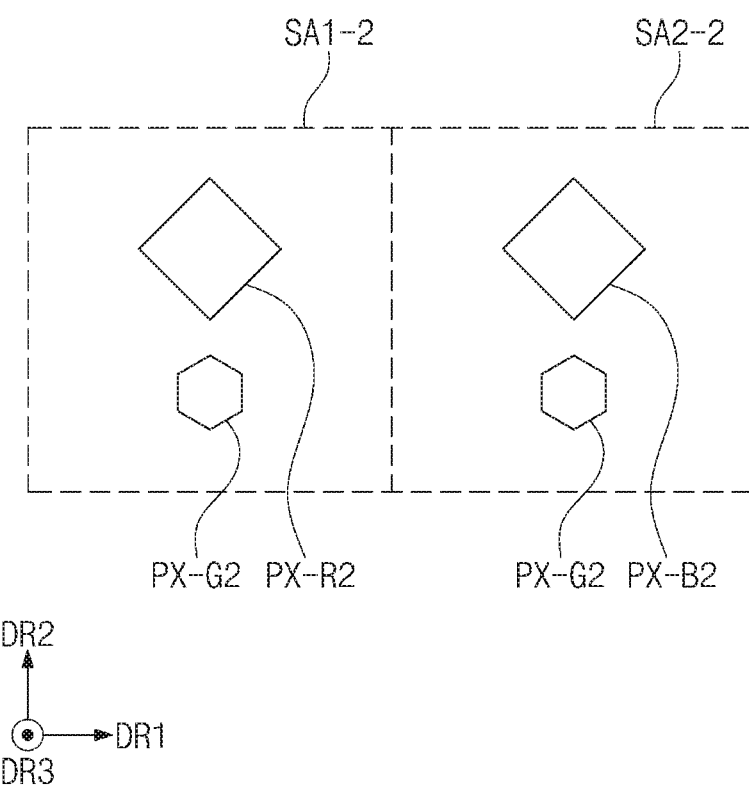
FIG. 9 illustrates an enlarged plan view showing the configuration of a display panel according to embodiments of the present inventive concept.

FIG. 9 illustrates an enlarged plan view showing the configuration of a display panel according to embodiments of the present inventive concept.

FIG. 9 illustrates a first sub-light emitting region SA1-2 and a second sub-light emitting region SA2-2.

A first pixel emission region PX-R2 and a second pixel emission region PX-G2 may be disposed in the first sub-light emitting region SA1-2. A second pixel emission region PX-G2 and a third pixel emission region PX-B2 may be disposed in the second sub-light emitting region SA2-2.

The first pixel emission region PX-R2 may be spaced apart in the first direction DR1 from the third pixel emission region PX-B2. The second pixel emission region PX-G2 disposed in the first sub-light emitting region SA1-2 may be spaced apart in the first direction DR1 from the second pixel emission region PX-G2 disposed in the second sub-light emitting region SA2-2.

On the first sub-light emitting region SA1-2, the second pixel emission region PX-G2 may be spaced apart in the second direction DR2 from the first pixel emission region PX-R2. On the second sub-light emitting region SA2-2, the second pixel emission region PX-G2 may be spaced apart in the second direction DR2 from the third pixel emission region PX-B2. For example, sub-pixels disposed in each of the first and second sub-light emitting regions SA1-2 and SA2-2 may be arranged in a single column.

Figure 10:
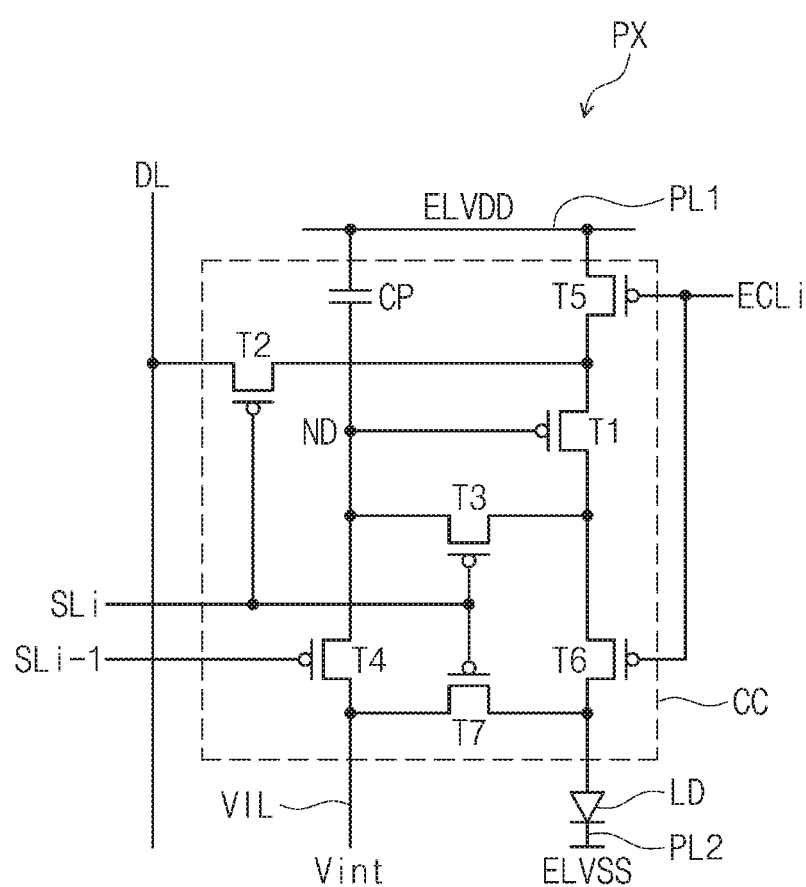
FIG. 10 illustrates an equivalent circuit diagram showing a sub-pixel according to embodiments of the present inventive concept.

FIG. 10 illustrates an equivalent circuit diagram showing a sub-pixel according to embodiments of the present inventive concept.

Referring to FIG. 10, a sub-pixel PX may be disposed in the active area (see AA of FIG. 1B) and may provide light.

The sub-pixel PX may be electrically connected to a plurality of signal lines. FIG. 10 shows, as examples of the signal lines, scan lines SLi and SLi−1, a data line DL, a first power line PL1, a second power line PL2, an initialization power line VIL, and an emission control line ECLi. These are merely examples, however, and the sub-pixel PX according to an embodiment may be connected to additional signal lines, or one or more of the illustrated signal lines may be omitted.

The sub-pixel PX may include a light emitting element LD and a pixel circuit CC. The pixel circuit CC may include first to seventh transistors T1 to T7 and a capacitor CP. In response to a data signal, the pixel circuit CC may control an amount of current flowing through the light emitting element LD.

The light emitting element LD may emit light at a certain brightness level in response to an amount of current provided from the pixel circuit CC. For this, a first power ELVDD may be set to a higher level than that of a second power ELVSS.

Each of the first to seventh transistors T1 to T7 may include an input electrode (or source electrode), an output electrode (or drain electrode), and a control electrode (or gate electrode). For convenience of description, one of the input and output electrodes may be called a first electrode in this specification, and the other of the input and output electrodes may be called a second electrode in this specification.

The first electrode of the first transistor T1 may be connected by way of the fifth transistor T5 to the first power line PL1. The first power line PL1 may be supplied with the first power ELVDD. The second electrode of the first transistor T1 may be coupled by way of the sixth transistor T6 to an anode electrode of the light emitting element LD. In this description, the first transistor T1 may be called a drive transistor.

In response to voltage applied to the control electrode of the first transistor T1, the first transistor T1 may control an amount of current flowing through the light emitting element LD.

A second transistor T2 is coupled between the data line DL and the first electrode of the first transistor T1. The control electrode of the second transistor T2 is coupled to an $i^{th}$ scan line SLi. When the $i^{th}$ scan line SLi is provided with an $i^{th}$ scan signal, the second transistor T2 is turned on to electrically couple the data line DL to the first electrode of the first transistor T1.

The third transistor T3 is coupled between the second electrode of the first transistor T1 and the control electrode of the first transistor T1. The control electrode of the third transistor T3 is coupled to the $i^{th}$ scan line SLi. When the $i^{th}$ scan line SLi is provided with the $i^{th}$ scan signal, the third transistor T3 is turned on to electrically couple the second electrode of the first transistor T1 to the control electrode of the first transistor T1. Accordingly, when the third transistor T3 is turned on, the first transistor T1 is coupled in a diode type.

The fourth transistor T4 is coupled between a node ND and the initialization power line VIL. The control electrode of the fourth transistor T4 is coupled to an $(i-1)^{th}$ scan line SLi-1. The node ND may be a node to which are coupled the fourth transistor T4 and the control electrode of the first transistor T1. When the $(i-1)^{th}$ scan line SLi-1 is provided with an $(i-1)^{th}$ scan signal, the fourth transistor T4 is turned on to provide the node ND with an initialization voltage Vint.

The fifth transistor T5 is coupled between the first power line PL1 and the first electrode of the first transistor T1. The sixth transistor T6 is coupled between the second electrode of the first transistor T1 and the anode electrode of the light emitting element LD. The emission control line ECLi, or an $i^{th}$ emission control line, is coupled with the control electrode of the fifth transistor T5 and the control electrode of the sixth transistor T6.

The seventh transistor T7 is coupled between the initialization power line VIL and the anode electrode of the light emitting element LD. The control electrode of the seventh transistor T7 is coupled to the $i^{th}$ scan line SLi. When the $i^{th}$ scan line SLi is provided with the $i^{th}$ scan signal, the seventh transistor T7 is turned on to provide the initialization voltage Vint to the anode electrode of the light emitting element LD.

The seventh transistor T7 may increase the capability of the sub-pixel PX in representing (e.g., displaying) black. For example, when the seventh transistor T7 is turned on, a parasitic capacitor (not shown) of the light emitting element LD is discharged. Then, when back brightness is implemented, a leakage current from the first transistor T1 may not allow the light emitting element LD to emit light, and as a result, the sub-pixel PX may have increased capability in representing black.

In addition, FIG. 10 shows that the control electrode of the seventh transistor T7 is coupled to the scan line SLi, but the present inventive concept is not limited to such an arrangement. In another embodiment, the control electrode of the seventh transistor T7 may be coupled to either the $(i-1)^{th}$ scan line SLi-1 or an $(i+1)^{th}$ scan line (not shown).

FIG. 10 depicts an example including PMOS transistors, but the present inventive concept is not limited to such an arrangement. In another embodiment, the pixel circuit CC may be configured to include NMOS transistors. In another embodiment, the pixel circuit CC may be configured to include a combination of NMOS and PMOS transistors.

The capacitor CP is disposed between the first power line PL1 and the node ND. The capacitor CP stores a voltage corresponding to a data signal. When the fifth and sixth transistors T5 and T6 are turned on due to the voltage stored in the capacitor CP, it may be determined an amount of current flowing through the first transistor T1.

The light emitting element LD may be electrically connected to the sixth transistor T6 and the second power line PL2. The light emitting element LD may receive the second power ELVSS through the second power line PL2. The light emitting element LD may include an emission layer.

The light emitting element LD may emit light due to a voltage that corresponds to a difference between a signal transferred through the sixth transistor T6 and the second power ELVSS received through the second power line PL2.

A structure of the sub-pixel PX is not limited to that shown in FIG. 10. In another embodiment, the sub-pixel PX may be implemented in various configurations suitable for the light emitting element LD to emit light.

Figure 11:
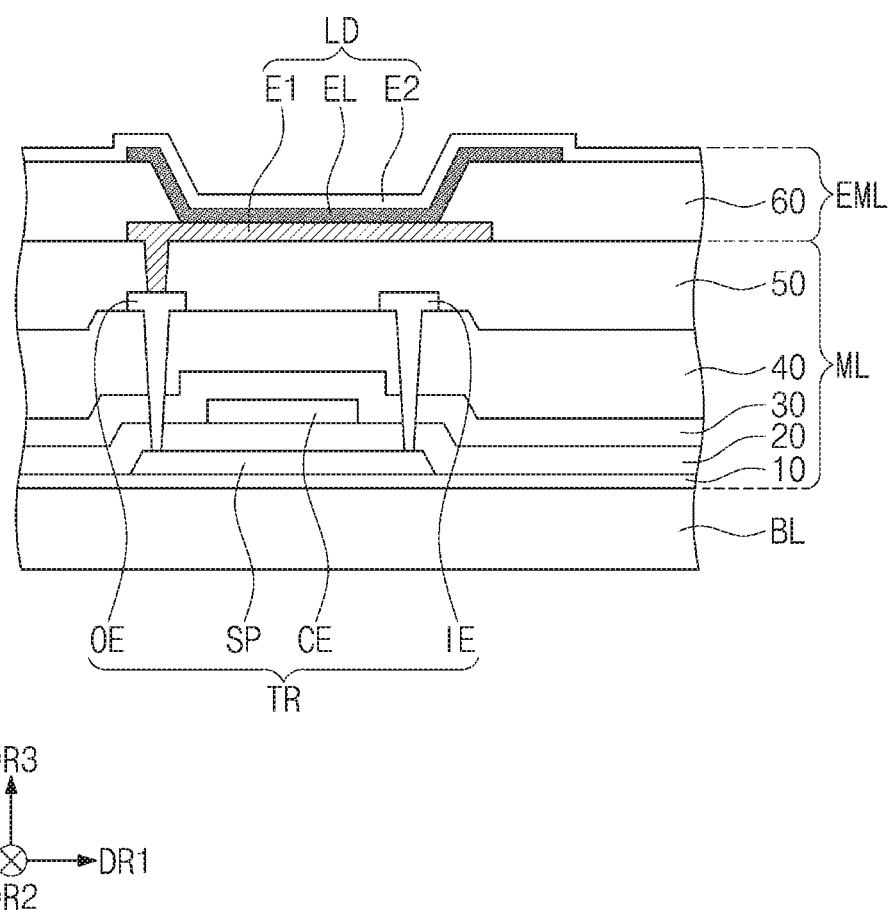
FIG. 11 illustrates a cross-sectional view showing the configuration of a display panel according to embodiments of the present inventive concept.

FIG. 11 illustrates a cross-sectional view showing the configuration of a display panel according to embodiments of the present inventive concept.

Referring to FIG. 11, a first dielectric layer 10 is disposed on a base layer BL. The first dielectric layer 10 may include a barrier layer and/or a buffer layer. The barrier layer may include an inorganic material. The barrier layer may prevent pixels from being affected by oxygen or moisture introduced through the base layer BL. The buffer layer may include an inorganic material. The buffer layer may provide a surface energy less than that of the base layer BL in order to stably form pixels on the base layer BL.

Each of the sub-pixels (see PX of FIG. 10) may include a pixel circuit (see CC of FIG. 10) and a light emitting element LD. The light emitting element LD may include a pixel electrode E1, an emission layer EL, and a common electrode E2.

FIG. 11 shows only one transistor TR included in the pixel circuit CC. The transistor TR may be the sixth transistor T6 discussed in FIG. 10.

The transistor TR may be disposed on the first dielectric layer 10. The transistor TR includes a semiconductor pattern SP, a control electrode CE, a first electrode IE, and a second electrode OE. The semiconductor pattern SP is disposed on the first dielectric layer 10. The semiconductor pattern SP may include a semiconductor material. The control electrode CE is spaced apart from the semiconductor pattern SP across a second dielectric layer 20.

The first electrode IE and the second electrode OE penetrate the second dielectric layer 20, a third dielectric layer 30, and a fourth dielectric layer 40, and are coupled respectively to one end and an other end of the semiconductor pattern SP. The transistor TR according to embodiments of the present inventive concept may be formed to have various stack structures, and is not limited to an example shown in FIG. 11.

A fifth dielectric layer 50 is disposed on the fourth dielectric layer 40, and covers the first electrode IE and the second electrode OE. The fifth dielectric layer 50 may include an organic material and/or an inorganic material, and may have a single-layered structure or a multi-layered structure.

In this description, the first to fifth dielectric layers 10 to 50 may be called a display circuit layer ML. A stack structure of the pixel circuit CC may correspond to a cross-sectional structure of the display circuit layer ML.

The pixel electrode E1 is disposed on the fifth dielectric layer 50. The pixel electrode E1 may penetrate the fifth dielectric layer 50 and may have electrical connection with the transistor TR. FIG. 11 shows that the pixel electrode E1 is directly connected to the transistor TR, but the pixel electrode E1 may be electrically connected to the transistor TR by way of the sixth transistor T6 illustrated in FIG. 10.

A sixth dielectric layer 60 may be disposed on the fifth dielectric layer 50. An opening may be defined in the sixth dielectric layer 60, and the opening may expose at least a portion of the pixel electrode E1. The sixth dielectric layer 60 may be a pixel definition layer. The opening may correspond to a pixel emission region of the sub-pixel (see PX of FIG. 10).

The emission layer EL may be disposed on the pixel electrode E1 exposed to the opening defined in the sixth dielectric layer 60. The emission layer EL may include a luminous material. For example, the emission layer EL may be configured to include one or more of a red-light emitting material, a green-light emitting material, and a blue-light emitting material. The emission layer EL may include a fluorescent material or a phosphorescent material. The emission layer EL may include an organic light emitting material or an inorganic light emitting material. The emission layer EL may emit light in response to a difference in potential between the pixel electrode E1 and the common electrode E2.

The common electrode E2 may be disposed on the emission layer EL. The common electrode E2 may have a single body that extends from the active area (see AA of FIG. 1B) to the peripheral area (see NAA of FIG. 1B). The common electrode E2 may be provided in common to a plurality of sub-pixels.

The common electrode E2 may include a transmissive conductive material or a transflective conductive material. Therefore, light generated from the emission layer EL may be easily emitted in the third direction DR3 through the common electrode E2. This configuration, however, is illustrated by way of example, and depending on design, the light emitting element LD according to embodiments of the present inventive concept may be, but are not limited to be, driven either in bottom emission mode in which the pixel electrode E1 includes a transmissive or transflective material or in dual emission mode in which light is emitted toward both front and rear sides.

Figure 12A:
FIG. 12A illustrates a cross-sectional view showing the configuration of a display panel according to embodiments of the present inventive concept.
Figure 12A:
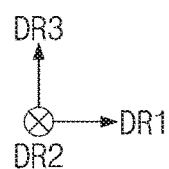

FIG. 12A illustrates a cross-sectional view showing the configuration of a display panel according to embodiments of the present inventive concept. FIG. 12A may be a cross-sectional view showing the transmission region TA of the display panel 210.

No pixels may be disposed on the transmission region TA. Therefore, the base layer BL, the first to sixth dielectric layers 10 to 60, and the common electrode E2 may be disposed on the transmission region TA.

To improve transmittance, one or more of the base layer BL, the first to sixth dielectric layers 10 to 60, and the common electrode E2 may be removed from the transmission region TA. In an embodiment, the common electrode E2 on the transmission region TA may have a thickness less than that of the common electrode E2 on the emission region (see EA of FIG. 6A).

Figure 12B:
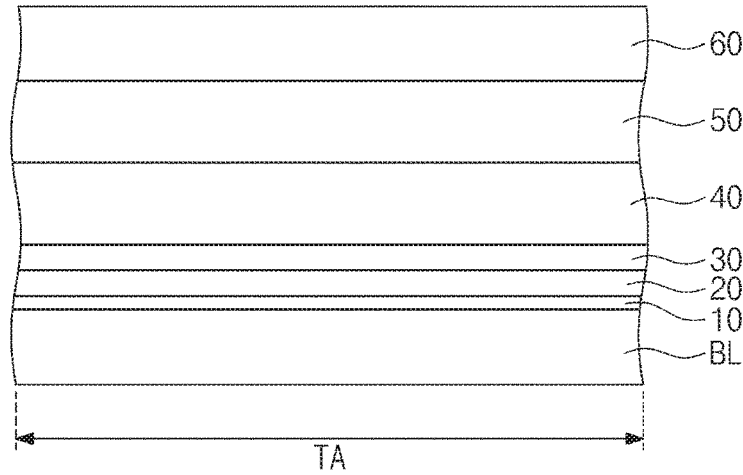
FIG. 12B illustrates a cross-sectional view showing the configuration of a display panel according to embodiments of the present inventive concept.
Figure 12B:
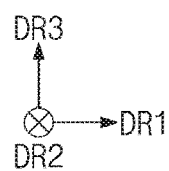

FIG. 12B illustrates a cross-sectional view showing the configuration of a display panel according to embodiments of the present inventive concept. FIG. 12B may be a cross-sectional view showing the transmission region TA of the display panel 210.

In comparison with FIG. 12A, the common electrode (see E2 of FIG. 11) may not be disposed on FIG. 12B. In an embodiment, the common electrode E2 may have a hole that overlaps the transmission region TA. Accordingly, the transmission region TA may increase in transmittance.

Figure 13A:
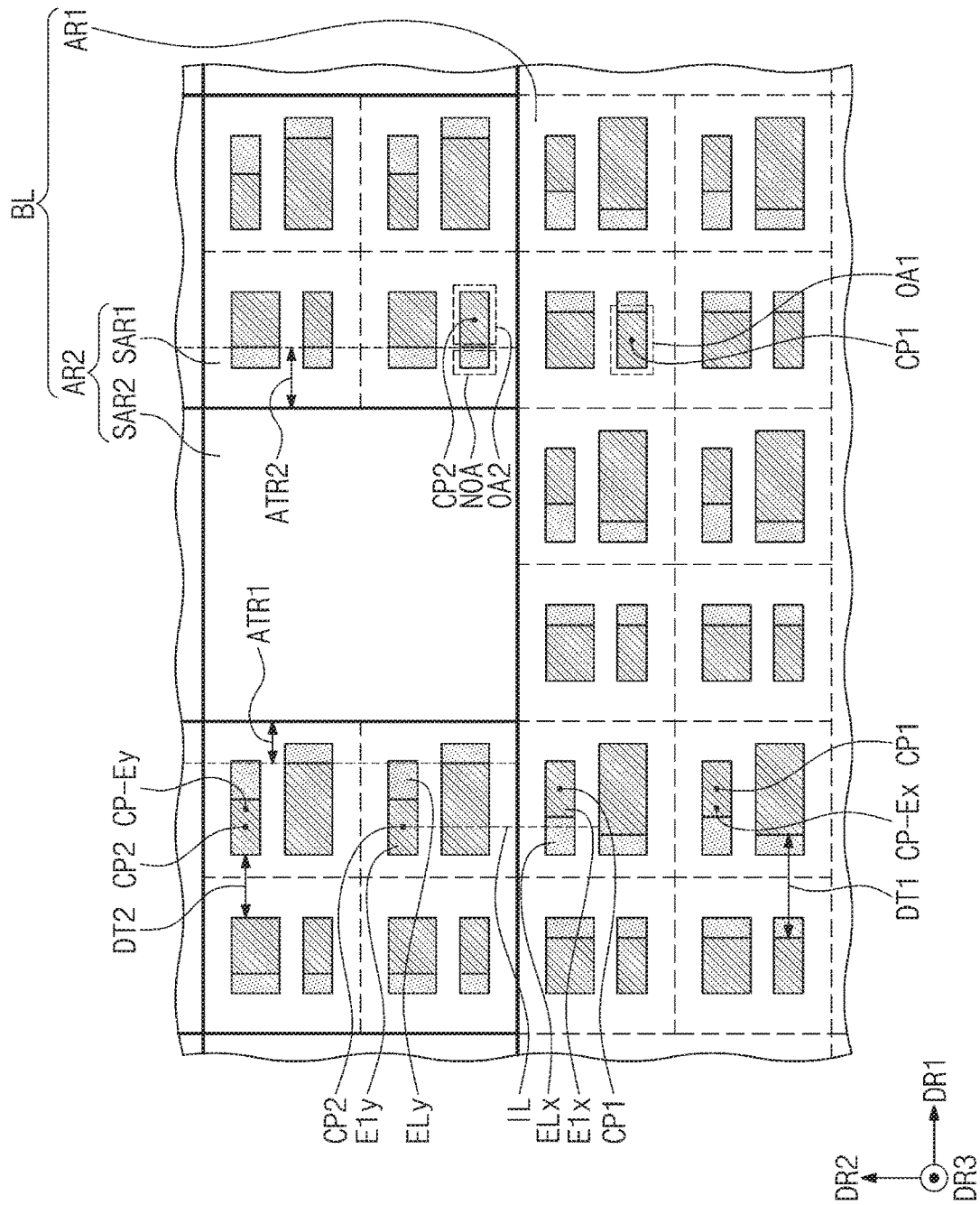
FIG. 13A illustrates a plan view showing the configuration of a display panel according to embodiments of the present inventive concept.
Figure 13B:
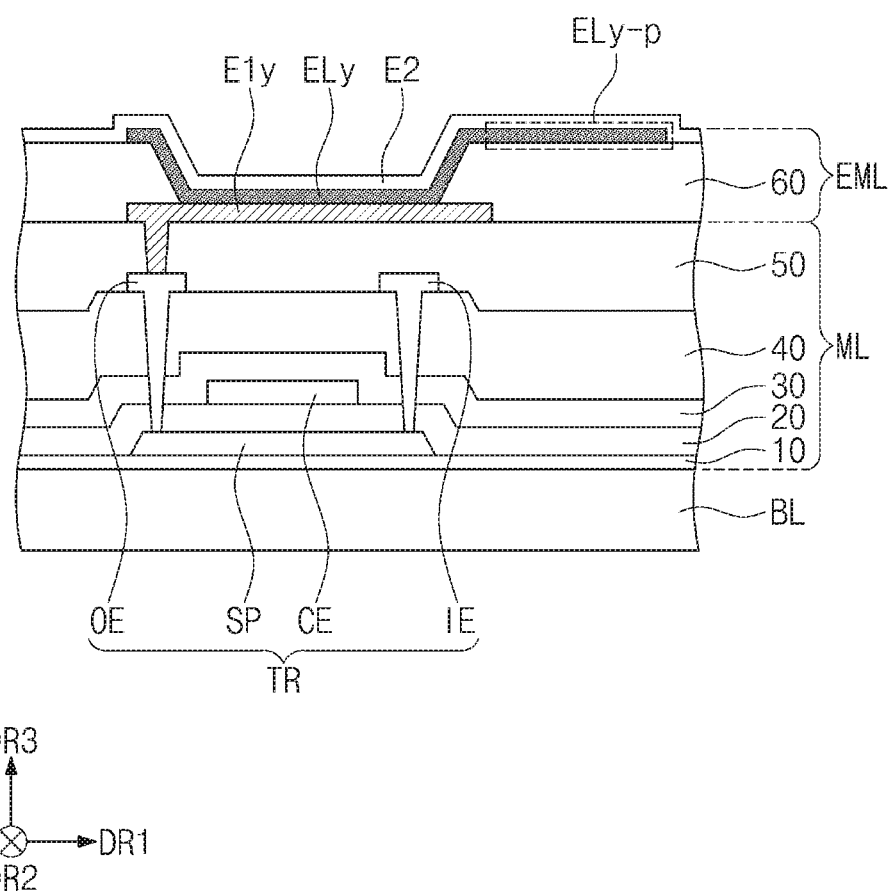
FIG. 13B illustrates a cross-sectional view showing the configuration of a display panel according to embodiments of the present inventive concept.

FIG. 13A illustrates a plan view showing the configuration of a display panel according to embodiments of the present inventive concept. FIG. 13B illustrates a cross-sectional view showing the configuration of a display panel according to embodiments of the present inventive concept.

FIG. 13A illustrates a base layer BL, pixel electrodes E1x and E1y, and emission layers ELx and ELy.

The base layer BL may include a first region AR1 and a second region AR2. The first region AR1 and the second region AR2 may be adjacent to each other in the second direction DR2. The first region AR1 is a zone that corresponds to the first display region (see DA1 of FIG. 4A). The second region AR2 is a zone that corresponds to the second display region (see DA2 of FIG. 4A).

The second region AR2 may include first sub-regions SAR1 and second sub-regions SAR2. The first sub-regions SAR1 may correspond to the emission regions (see EA of FIG. 6A). The second sub-regions SAR2 may correspond to the transmission regions (see TA of FIG. 6A). The first sub-regions SAR1 and the second sub-regions SAR2 may be defined alternately in the first and second directions DR1 and DR2.

The pixel electrodes E1x and E1y may include a first pixel electrode E1x and a second pixel electrode E1y. The first pixel electrode E1x may be disposed on the first region AR1. The second pixel electrode E1y may be disposed on the second region AR2. For example, the second pixel electrode E1y may be placed on the first sub-regions SAR1. The second pixel electrode E1y may not be disposed on the second sub-regions SAR2.

The emission layers ELx and ELy may include a first emission layer ELx and a second emission layer ELy. The first emission layer ELx may be disposed on the first region AR1. The second emission layer ELy may be disposed on the second region AR2. For example, the second emission layer ELy may be placed on the first sub-regions SAR1.

The first emission layer ELx may be provided in plural, and the second emission layer ELy may be provided in plural. In an embodiment, the first emission layers ELx and the second emission layers ELy may be arranged in the same way. For example, each of the first emission layers ELx may have the same size as that of a corresponding one of the second emission layers ELy, and a spacing between the first emission layers ELx may be the same as that between the second emission layers ELy.

The first pixel electrode E1x may be provided in plural, and the second pixel electrode E1y may be provided in plural. In an embodiment, the first pixel electrodes E1x may be arranged in a first arrangement, and the second pixel electrodes E1y may be arranged in a second arrangement different from the first arrangement. For example, a first minimum distance DT1 between the first pixel electrodes E1x may be different from a second minimum distance DT2 between the second pixel electrodes E1y. The first minimum distance DT1 may be an interval between two first pixel electrodes E1x that are spaced apart from and closest in adjacency to each other in the first direction DR1. The second minimum distance DT2 may be an interval between two second pixel electrodes E1y that are spaced apart from and closest in adjacency to each other in the first direction DR1.

The first emission layer ELx may be disposed on the first pixel electrode E1x, and the second emission layer ELy may be disposed on the second pixel electrode E1y. When viewed on a plane, a portion of the first emission layer ELx may overlap the first pixel electrode E1x, and a portion of the second emission layer ELy may overlap the second pixel electrode E1y. The first emission layer ELx may have an area greater than that of the first pixel electrode E1x, and the second emission layer ELy may have an area greater than that of the second pixel electrode E1y.

According to embodiments of the present inventive concept, the second pixel electrode E1y may be shifted from the second emission layer ELy in a direction away from the second sub-regions SAR2. That is, a closer portion of the second emission layer ELy is closer to the second sub-regions SAR2 than a farther portion of the second emission layer ELy that overlaps the second pixel electrode E1y. The closer portion of the second emission layer ELy does not overlap with the second pixel electrode E1y. In other words, the second pixel electrode E1y does not overlap an edge of the second emission layer ELy closest among all its edges to the second sub-regions SAR2. The second pixel electrode E1y may have transmittance less than that of the second emission layer ELy. For example, the second pixel electrode E1y may include an opaque metal. Because the second pixel electrode E1y is shifted in a direction away from the second sub-regions SAR2, the display panel (see 210 of FIG. 4A) may have an increased transmittance at a portion that corresponds to partial regions ATR1 and ATR2 of the first sub-regions SAR1. Accordingly, the electronic modules (see 500 of FIG. 1B) below the second region AR2 may increase in sensitivity.

Referring to FIG. 13B, the second emission layer ELy is shifted from the second pixel electrode E1y. Therefore, when viewed in the third direction DR3, the closer portion E1y-p of the second emission layer ELy dose not overlap with the second pixel electrode E1y.

A first overlapping region OA1 is defined where the first emission layer ELx overlaps the first pixel electrode E1x, and a second overlapping region OA2 is defined where the second emission layer ELy overlaps the second pixel electrode E1y. Because the second pixel electrode E1y is shifted from the second emission layer ELy, a non-overlapping region NOA may be disposed between the second overlapping region OA2 and the second sub-regions SAR2. The non-overlapping region NOA may have transmittance greater than that of the second overlapping region OA2.

A center CP2 of the second overlapping region OA2 may be spaced apart from a center CP-Ey of the second emission layer ELy. For example, the center CP2 may be spaced apart from the center CP-Ey in a direction away from a closest adjacent one of the second sub-regions SAR2. Thus, the center CP-Ey may be disposed between the center CP2 and the closest adjacent one of the second sub-regions SAR2.

A center CP1 of the first overlapping region OA1 may be spaced apart from a center CP-Ex of the first emission layer ELx. For example, when the center CP2 is spaced apart in the first direction DR1 from the center CP-Ey, the center CP1 may be spaced apart from the center CP-Ex in a direction opposite to the first direction DR1. As shown in FIG. 13A, when the center CP2 is disposed on a left side of the center CP-Ey, the center CP1 may be disposed on a right side of the center CP-Ex. This configuration will be explained with an example where the first pixel electrode E1x and the second pixel electrode E1y are spaced apart in the second direction DR2, and where the first emission layer ELx and the second emission layer ELy are spaced apart in the second direction DR2.

The center CP-Ey of the second emission layer ELy and the center CP-Ex of the first emission layer ELx may be disposed on the same imaginary line that extends in the second direction DR2. In contrast, neither the center CP1 of the first overlapping region OA1 nor the center CP2 of the second overlapping region OA2 may be disposed on the same imaginary line that extends in the second direction DR2. For example, the center CP1 may not overlap an imaginary line IL that passes through the center CP2 and extends in the second direction DR2.

Figure 14A:
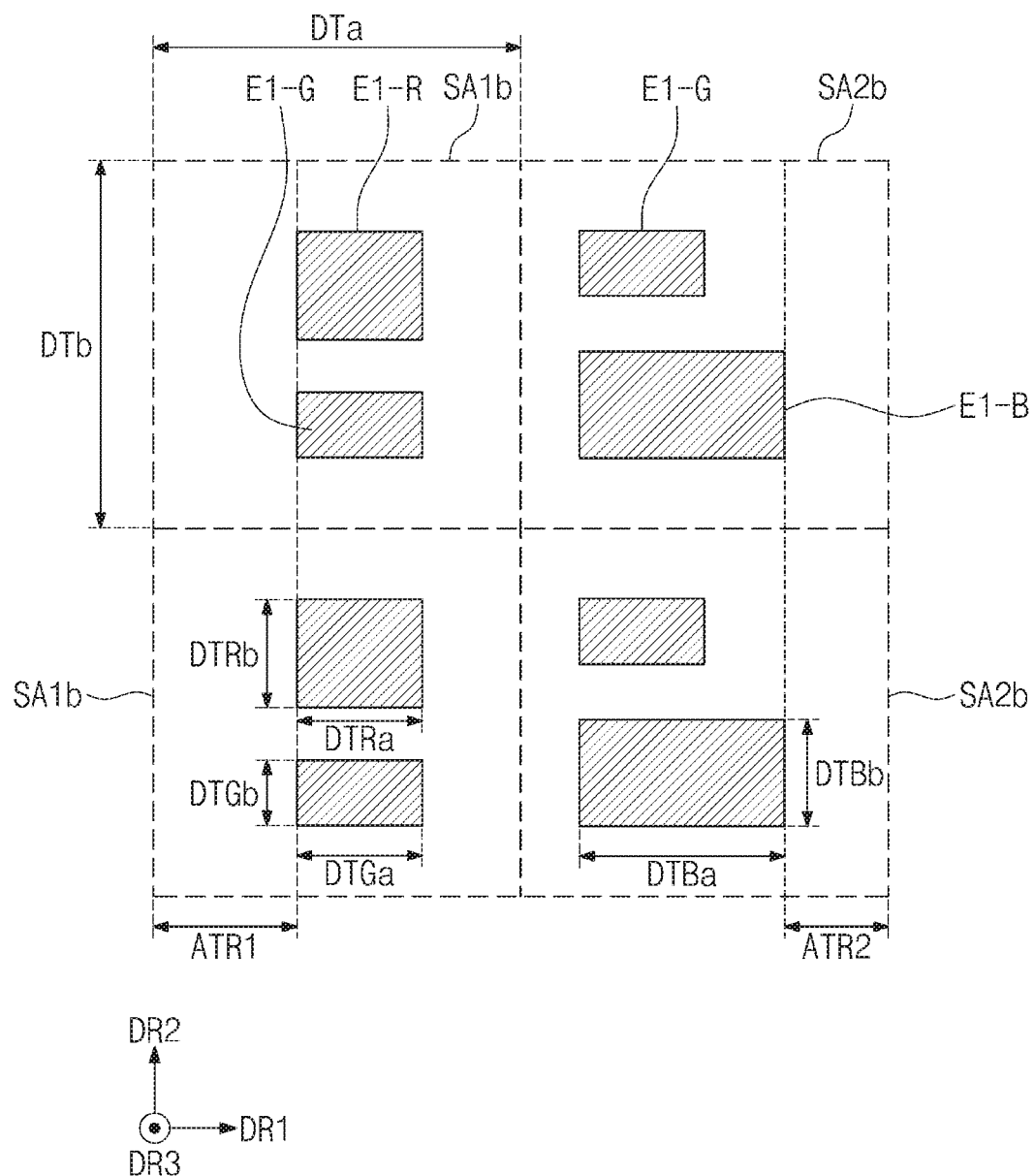
FIG. 14A illustrates a plan view showing the configuration of a display panel according to embodiments of the present inventive concept.

FIG. 14A illustrates a plan view showing a display panel according to embodiments of the present inventive concept.

Figure 14B:
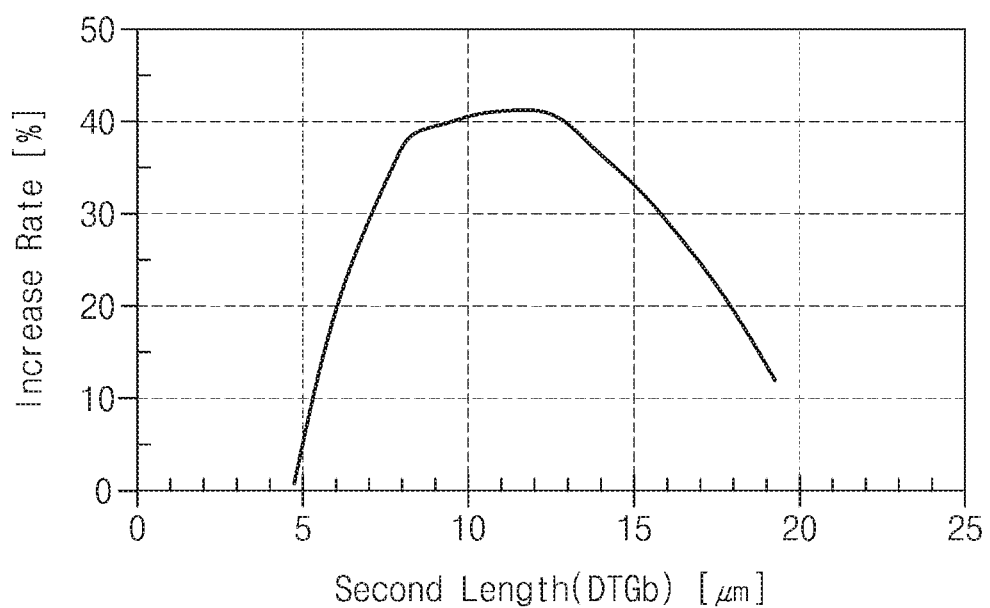
FIG. 14B illustrates a graph showing an increase rate of a transmittance enhancement region versus a variation in length of a second sub-pixel electrode.

FIG. 14B illustrates a graph showing an increase rate of a transmittance enhancement region versus a variation in length of a second sub-pixel electrode.

Referring to FIGS. 14A and 14B, one emission region (see EA of FIG. 6A) is illustrated. The emission region EA may include four sub-light emitting regions SA1b and SA2b. Thus, the emission region EA may include two first pixel emission regions (see PX-R of FIG. 7), four second pixel emission regions (see PX-G of FIG. 7), and two third pixel emission regions (see PX-B of FIG. 7).

FIG. 14A shows first, second, and third sub-pixel electrodes E1-R, E1-G, and E1-B that are disposed on the first, second, and third pixel emission regions PX-R, PX-G, and PX-B.

According to embodiments of the present inventive concept, transmittance of the emission region EA may be increased by adjustment of positions of the first, second, and third sub-pixel electrodes E1-R, E1-G, and E1-B.

When a product is determined in terms of resolution and size, it may be possible to obtain a first width DTa and a second width DTb of each of the sub-light emitting regions SA1b and SA2b, minimum margin and spacing between the first, second, and third sub-pixel electrodes E1-R, E1-G, and E1-B, and areas of the first, second, and third sub-pixel electrodes E1-R, E1-G, and E1-B.

The first width DTa may be a length parallel to the first direction DR1, and the second width DTb may be a length parallel to the second direction DR2. For example, the first width DTa and the second width DTb may each be about 63 μm. The minimum spacing may be about 13.8 μm. The minimum margin may be about 5 μm. The area of the first sub-pixel electrode E1-R may be about 379.1 μm², the area of the second sub-pixel electrode E1-G may be about 263.7 μm², and the area of the third sub-pixel electrode E1-B may be about 703.6 μm².

The area of the first sub-pixel electrode E1-R may correspond to a product of first and second lengths DTRa and DTRb of the first sub-pixel electrode E1-R, the area of the second sub-pixel electrode E1-G may correspond to a product of first and second lengths DTGa and DTGb of the second sub-pixel electrode E1-G, and the area of the third sub-pixel electrode E1-B may correspond to a product of first and second lengths DTBa and DTBb of the third sub-pixel electrode E1-B. The first lengths DTRa, DTGa, and DTBa may be lengths of sides that extend in the first direction DR1, and the second lengths DTRb, DTGb, and DTBb may be lengths of sides that extend in the second direction DR2.

Each of the first, second, and third sub-pixel electrodes E1-R, E1-G, and E1-B may have a quadrangular shape when viewed on a plane. In addition, each of emission layers on the first, second, and third sub-pixel electrodes E1-R, E1-G, and E1-B may also have a quadrangular shape when viewed on a plane.

FIG. 14B is a graph showing a ratio of a transmittance enhancement region depending on a variation in the second length DTGb of the second sub-pixel electrode E1-G.

The transmittance enhancement region may correspond to partial regions ATR1 and ATR2. The partial regions ATR1 and ATR2 may correspond to zones having none of the first, second, and third sub-pixel electrodes E1-R, E1-G, and E1-B. The ratio of the transmittance enhancement region may be a ratio of areas of the partial regions ATR1 and ATR2 to an area of the emission region EA.

The following Equation 1 may be defined to refer to a first value that corresponds to a sum of the second lengths DTRb and DTGb, and also to a second value that corresponds to a sum of the second lengths DTGb and DTBb.

$$\text{First value}=\text{second value}=\text{second width}-2*(\text{minimum spacing})-\text{minimum margin} \quad \text{[Equation 1]}$$

According to Equation 1 above, the first value and the second value may each be about 30.4 µm. Therefore, when the second length DTGb of the second sub-pixel electrode E1-G is determined alone, it may be possible to obtain the second length DTRb and the second length DTBb. In addition, because the areas of the first, second, and third sub-pixel electrodes E1-R, E1-G, and E1-B are determined, it may also be possible to obtain the first lengths DTRa, DTGa, and DTBa.

As a result of measuring how the ratio of the transmittance enhancement region changes with the second length DTGb, when the second length DTGb is about 11.55 µm, the ratio has about 41.3% with the highest increase rate. In this case, it may be determined that the first length DTRa is about 20.11 µm, the first length DTGa is about 22.83 µm, the first length DTBa is about 37.33 µm, the second length DTRb is about 18.85 µm, the second length DTBb is about 18.85 µm.

Figure 15:
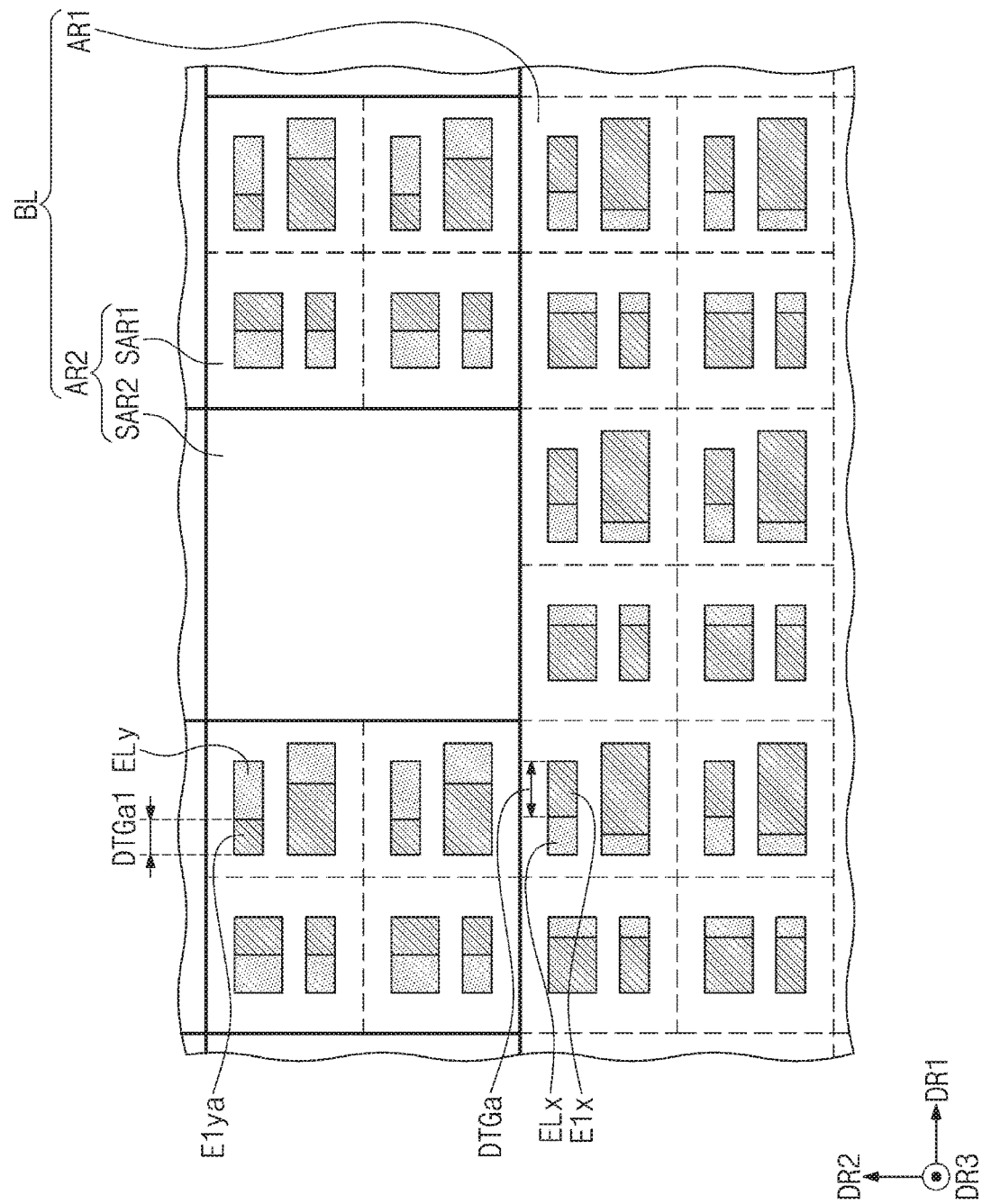
FIG. 15 illustrates a plan view showing the configuration of a display panel according to embodiments of the present inventive concept.

FIG. 15 illustrates a plan view showing the configuration of a display panel according to embodiments of the present inventive concept. In description of FIG. 15, the same component as that of FIG. 13A is allocated to the same reference symbol, and a repetitive explanation will be omitted.

FIG. 15 illustrates a base layer BL, pixel electrodes E1$x$ and E1$ya$, and emission layers ELx and ELy.

The pixel electrodes E1$x$ and E1$ya$ may include a first pixel electrode E1$x$ and a second pixel electrode E1$ya$. The first pixel electrode E1$x$ may be disposed on the first region AR1. The second pixel electrode E1$ya$ may be disposed on the second region AR2. For example, the second pixel electrode E1$ya$ may be placed on the first sub-regions SAR1.

Each of the first and second pixel electrodes E1$x$ and E1$ya$ may be the second sub-pixel electrode (see E1-G of FIG. 14A). In an embodiment, a first length DTGa1 may be less than a first length DTGa. Therefore, the second pixel electrode E1$ya$ may have a size less than that of the first pixel electrode E1$x$. As a result, the first sub-region SAR1 may have an increased transmittance at its portion adjacent to the second sub-region SAR2.

Although FIG. 15 illustrates only the first and second pixel electrodes E1$x$ and E1$ya$ each of which corresponds to the second sub-pixel electrode E1-G, this explanation may also be applicable to pixel electrodes that correspond to the first sub-pixel electrode (see E1-R of FIG. 14A) and to pixel electrodes that correspond to the third sub-pixel electrode (see E1-B of FIG. 14A).

Figure 16A:
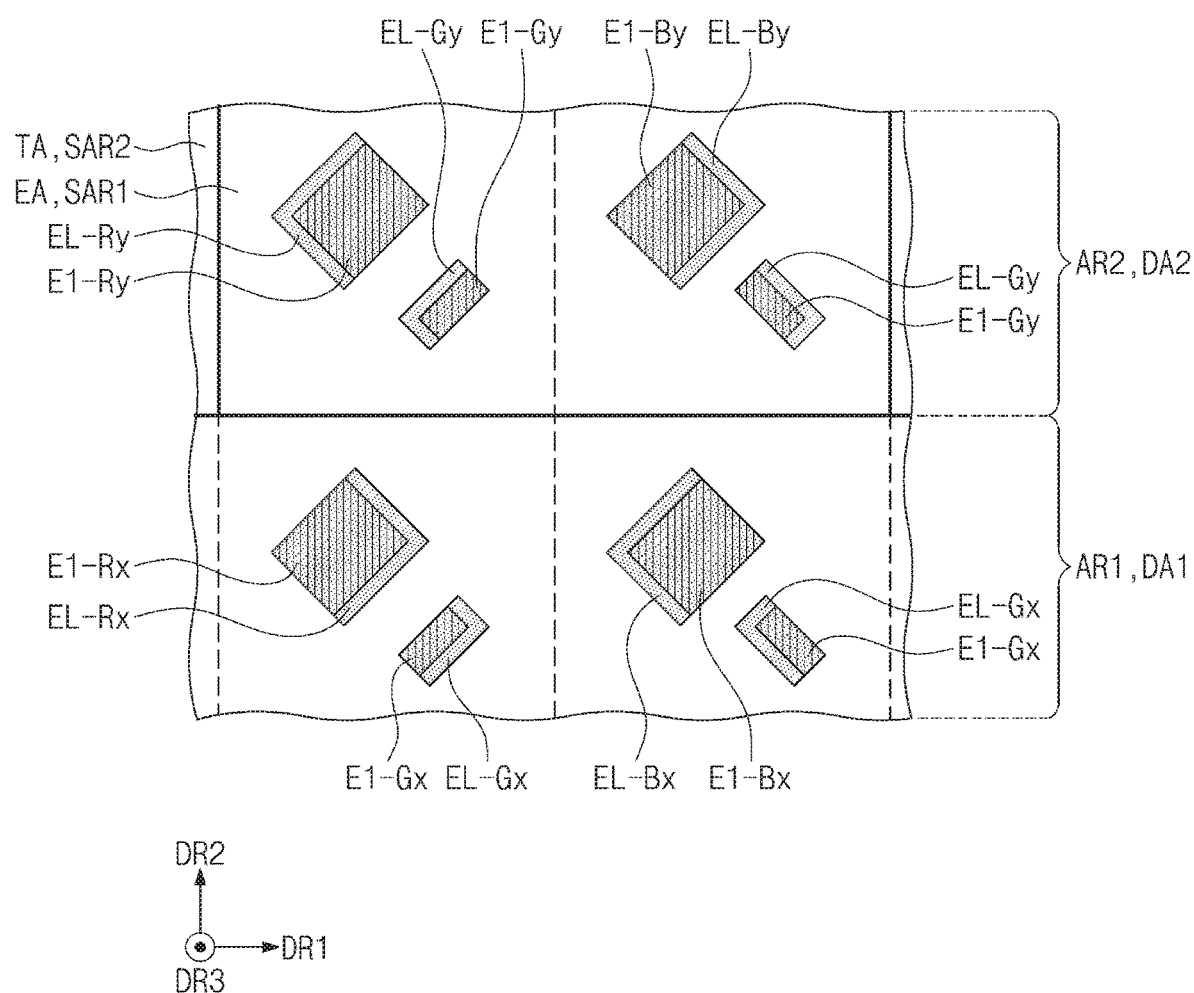
FIG. 16A illustrates a plan view showing the configuration of a display panel according to embodiments of the present inventive concept.

FIG. 16A illustrates a plan view showing the configuration of a display panel according to embodiments of the present inventive concept.

FIG. 16A illustrates first, second, and third sub-pixel electrodes E1-Rx, E1-Gx, E1-Bx, E1-Ry, E1-Gy, and E1-By and first, second, and third sub-emission layers EL-Rx, EL-Gx, EL-Bx, EL-Ry, EL-Gy, and EL-By.

The first, second, and third sub-pixel electrodes E1-Rx, E1-Gx, and E1-Bx and the first, second, and third sub-emission layers EL-Rx, EL-Gx, and EL-Bx may be disposed on the first region AR1 and included in the first display region DA1.

The first, second, and third sub-pixel electrodes E1-Ry, E1-Gy, and E1-By and the first, second, and third sub-emission layers EL-Ry, EL-Gy, and EL-By may be disposed on the first sub-region SAR1 and included in the second display region DA2.

On the first sub-region SAR1, because the first, second, and third sub-pixel electrodes E1-Ry, E1-Gy, and E1-By are shifted relative to the first, second, and third sub-emission layers EL-Ry, EL-Gy, and EL-By, areas of the first, second, and third sub-emission layers EL-Rx, EL-Gx, EL-Bx, EL-Ry, EL-Gy, and EL-By may be greater than those of the first, second, and third sub-pixel electrodes E1-Rx, E1-Gx, E1-Bx, E1-Ry, E1-Gy, and E1-By, respectively.

On the first sub-region SAR1, the first, second, and third sub-pixel electrodes E1-Ry, E1-Gy, and E1-By may be shifted relative to the first, second, and third sub-emission layers EL-Ry, EL-Gy, and EL-By in a direction away from the second sub-region SAR2 (or from the transmission region TA).

Figure 16B:
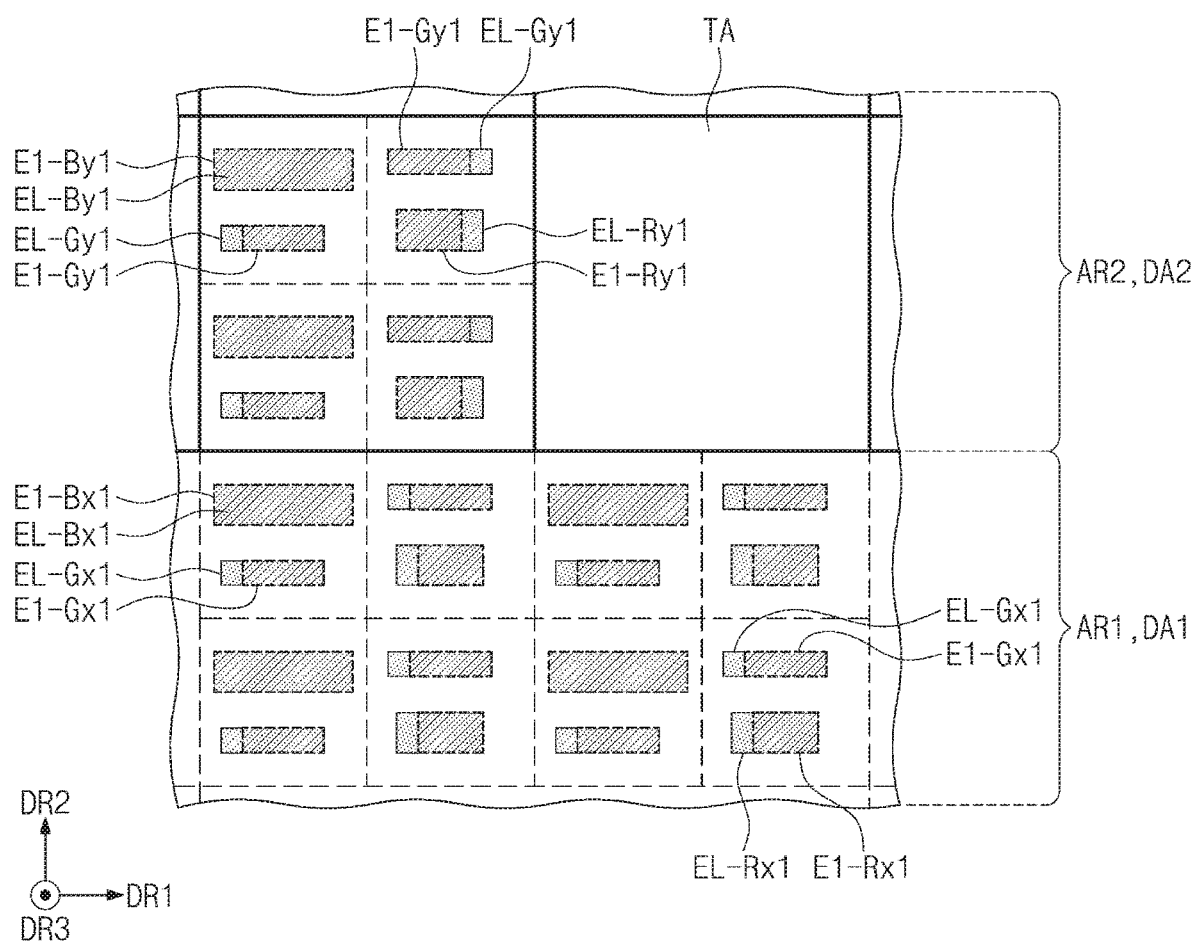
FIG. 16B illustrates a plan view showing the configuration of a display panel according to embodiments of the present inventive concept.

FIG. 16B illustrates a plan view showing the configuration of a display panel according to embodiments of the present inventive concept.

FIG. 16B illustrates first, second, and third sub-pixel electrodes E1-Rx1, E1-Gx1, E1-Bx1, E1-Ry1, E1-Gy1, and E1-By1 and first, second, and third sub-emission layers EL-Rx1, EL-Gx1, EL-Bx1, EL-Ry1, EL-Gy1, and EL-By1.

The first, second, and third sub-pixel electrodes E1-Rx1, E1-Gx1, and E1-Bx1 and the first, second, and third sub-emission layers EL-Rx1, EL-Gx1, and EL-Bx1 may be disposed on the first region AR1 and included in the first display region DA1.

The first, second, and third sub-pixel electrodes E1-Ry1, E1-Gy1, and E1-By1 and the first, second, and third sub-emission layers EL-Ry1, EL-Gy1, and EL-By1 may be disposed on the second region AR2 and included in the second display region DA2.

On the second region AR2, one or more of the first, second, and third sub-pixel electrodes E1-Ry1, E1-Gy1, and E1-By1 may be shifted relative to corresponding one or more of the first, second, and third sub-emission layers EL-Ry1, EL-Gy1, and EL-By1.

For example, a positional relationship between the first sub-pixel electrode E1-Rx1 and the first sub-emission layer EL-Rx1 that are disposed on the first region AR1 may be different from that between the first sub-pixel electrode E1-Ry1 and the first sub-emission layer EL-Ry1 that are disposed on the second region AR2. On the second region AR2, the first sub-pixel electrode E1-Ry1 may be shifted relative to the first sub-emission layer EL-Ry1 in a direction away from the transmission region TA.

A positional relationship between the second sub-pixel electrode E1-Gx1 and the second sub-emission layer EL-Gx1 that are disposed on the first region AR1 may be share at least some characteristics with that between the second sub-pixel electrode E1-Gy1 and the second sub-emission layer EL-Gy1 that are disposed on the second region AR2. For example, only the second sub-pixel electrode E1-Gy1 spaced apart in the second direction DR2 from the first sub-pixel electrode E1-Ry1 may be shifted relative to the second sub-emission layer EL-Gy1 in a direction away from the transmission region TA.

A position of the third sub-pixel electrode E1-By1 relative to the third sub-emission layer EL-By1 may be the same on the first and second regions AR1 and AR2.

Figure 16C:
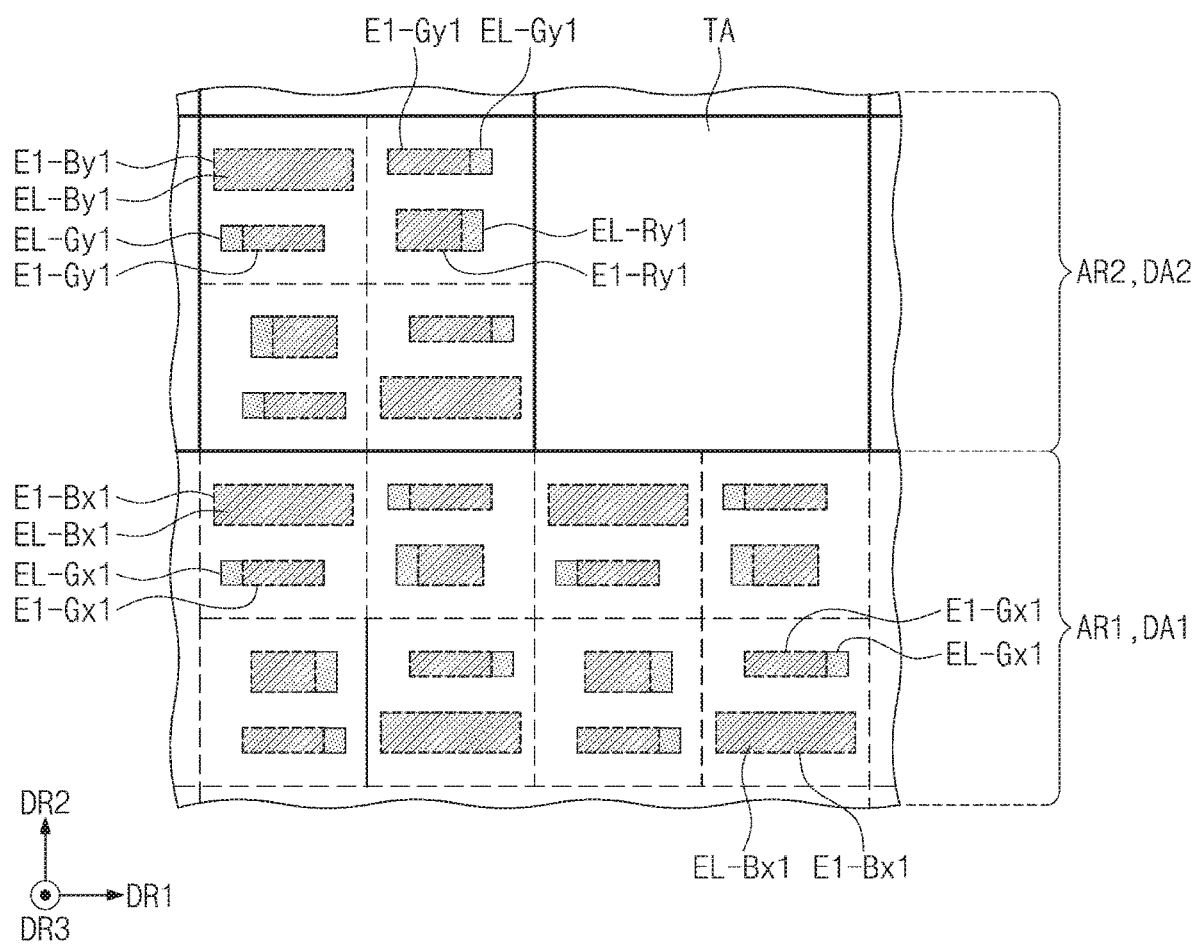
FIG. 16C illustrates a plan view showing the configuration of a display panel according to embodiments of the present inventive concept.

FIG. 16C illustrates a plan view showing the configuration of a display panel according to embodiments of the present inventive concept. In the embodiment of FIG. 16C, a different configuration from that discussed above in FIG. 16B will be explained, and the remaining explanation will be omitted.

FIG. 16C illustrates first, second, and third sub-pixel electrodes E1-Rx1, E1-Gx1, E1-Bx1, E1-Ry1, E1-Gy1, and E1-By1 and first, second, and third sub-emission layers EL-Rx1, EL-Gx1, EL-Bx1, EL-Ry1, EL-Gy1, and EL-By1.

In the embodiment illustrated above in FIG. 16B, the third sub-pixel electrode E1-By1 and the second sub-pixel electrode E1-Gy1 are alternately arranged along the second direction DR2, and the second sub-pixel electrode E1-Gy1 and the first sub-pixel electrode E1-Ry1 are alternately arranged along the second direction DR2. In FIG. 16C, when a single unit is defined to include the third sub-pixel electrode E1-By1, the second sub-pixel electrode E1-Gy1, the first sub-pixel electrode E1-Ry1, and the second sub-pixel electrode E1-Gy1 that are arranged along the second direction DR2, the single unit may be repeatedly arranged along the second direction DR2.

In the single unit, a certain one of two second sub-pixel electrodes E1-Gy1 may be shifted relative to the second sub-emission layer EL-Gy1 in a direction away from the transmission region TA. For example, a positional relationship between the second sub-emission layer EL-Gy1 and the certain one of two second sub-pixel electrodes E1-Gy1 may be different between the first region AR1 and the second region AR2, and a positional relationship between the second sub-emission layer EL-Gy1 and the other of two second sub-pixel electrodes E1-Gy1 may be the same on the first region AR1 and the second region AR2.

Figure 16D:
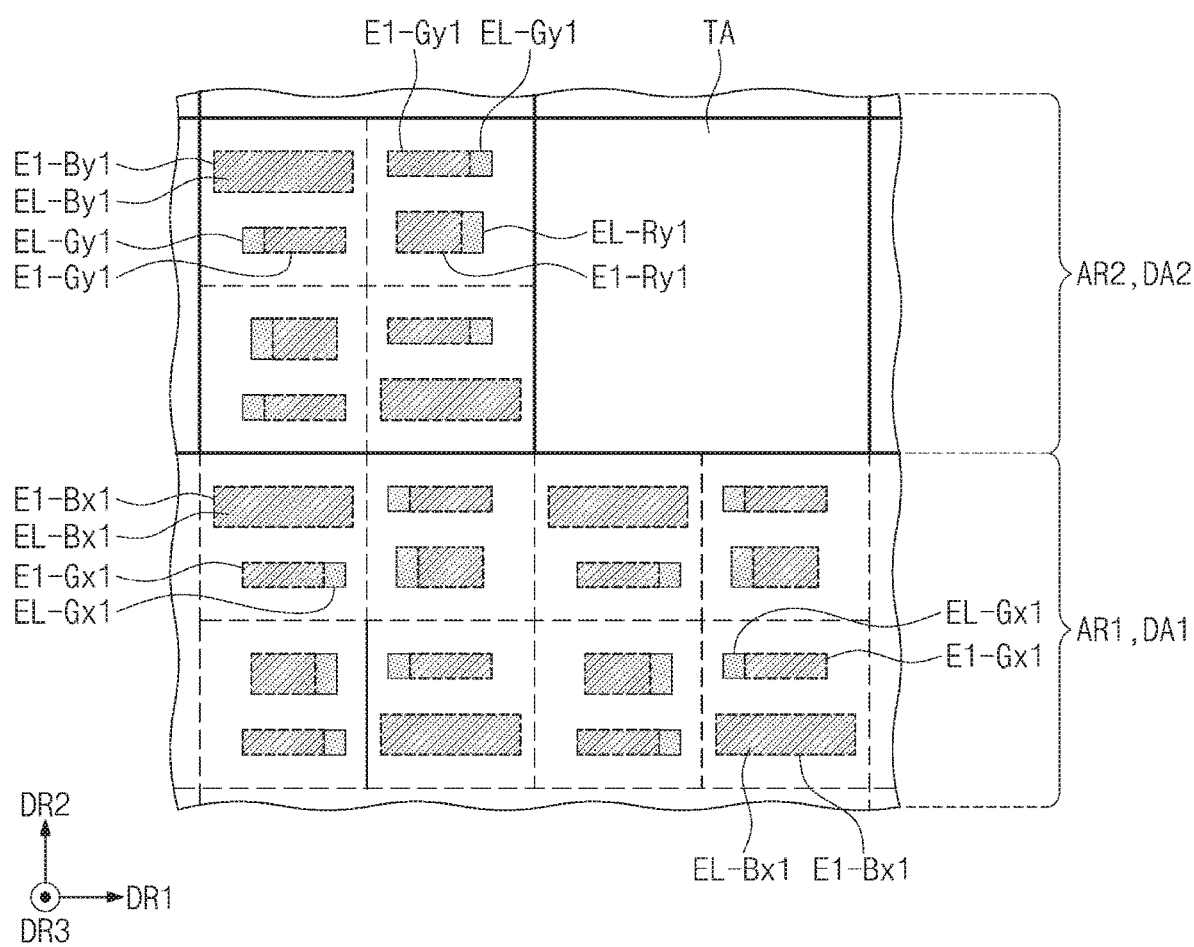
FIG. 16D illustrates a plan view showing the configuration of a display panel according to embodiments of the present inventive concept.

FIG. 16D illustrates a plan view showing the configuration of a display panel according to embodiments of the present inventive concept. In the embodiment of FIG. 16D, a different configuration from that discussed above in FIG. 16B will be explained, and the remaining explanation will be omitted.

FIG. 16D illustrates first, second, and third sub-pixel electrodes E1-Rx1, E1-Gx1, E1-Bx1, E1-Ry1, E1-Gy1, and E1-By1 and first, second, and third sub-emission layers EL-Rx1, EL-Gx1, EL-Bx1, EL-Ry1, EL-Gy1, and EL-By1.

In the embodiment illustrated above in FIG. 16B, the third sub-pixel electrode E1-By1 and the second sub-pixel electrode E1-Gy1 are arranged along the second direction DR2, and the second sub-pixel electrode E1-Gy1 and the first sub-pixel electrode E1-Ry1 are arranged along the second direction DR2. In FIG. 16D, when a single unit is defined to include the third sub-pixel electrode E1-By1, the second sub-pixel electrode E1-Gy1, the first sub-pixel electrode E1-Ry1, and the second sub-pixel electrode E1-Gy1 that are arranged along the second direction DR2, the single unit may be repeatedly arranged along the second direction DR2.

FIGS. 16C and 16D depict by way of example that the third sub-pixel electrodes E1-Bx1 and E1-By1 and the third sub-emission layers EL-Bx1 and EL-By1 have the same size, but the present inventive concept is not limited to such an arrangement. For example, in an embodiment, the third sub-pixel electrodes E1-Bx1 and E1-By1 may have a size less than that of the third sub-emission layers EL-Bx1 and EL-By1.

Figure 17:
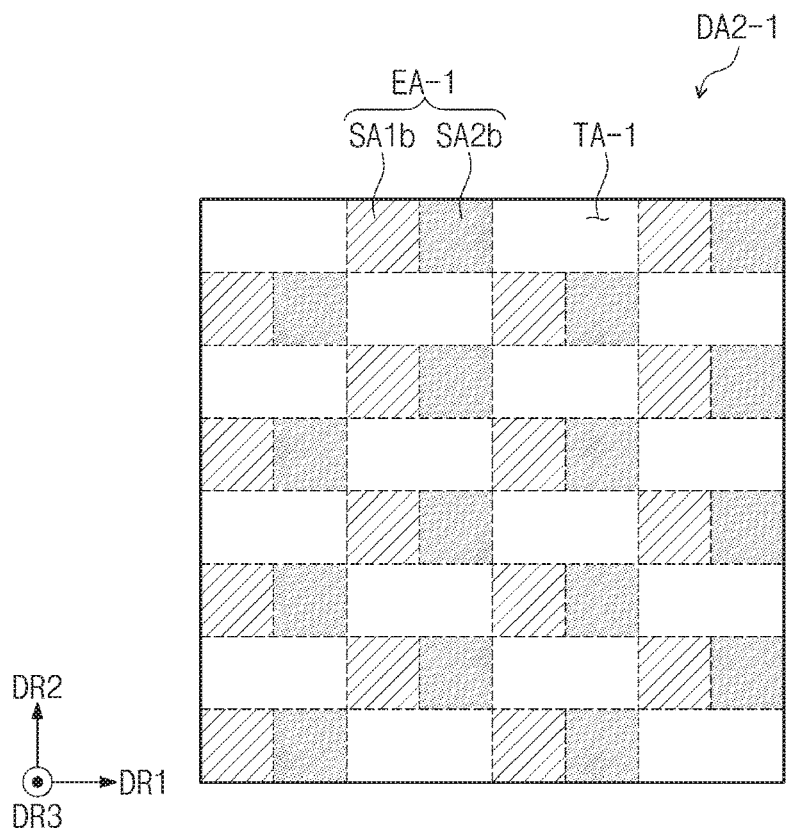
FIG. 17 illustrates an enlarged plan view partially showing a display panel according to embodiments of the present inventive concept.

FIG. 17 illustrates an enlarged plan view partially showing a display panel according to embodiments of the present inventive concept. A second display region DA2-1 is illustrated in an enlarged view showing a portion of one of the second display regions DA2, DA2a, and DA2b depicted in FIGS. 4A to 4C.

Referring to FIG. 17, the second display region DA2-1 may include emission regions EA-1 and transmission regions TA-1. The emission regions EA-1 and the transmission regions TA-1 may be alternately arranged along the first direction DR1 and also along the second direction DR2. An area of each of the transmission regions TA-1 may correspond to that of each of the emission regions EA-1.

Each of the emission regions EA-1 may include two sub-light emitting regions SA1$b$ and SA2$b$. The sub-light emitting regions SA1$b$ and SA2$b$ may include a first sub-light emitting region SA1$b$ and a second sub-light emitting region SA2$b$. In an embodiment, each of the emission regions EA-1 may include one first sub-light emitting region SA1$b$ and one second sub-light emitting region SA2$b$. The first sub-light emitting region SA1$b$ and the second sub-light emitting region SA2$b$ may be arranged in the first direction DR1.

Figure 18:
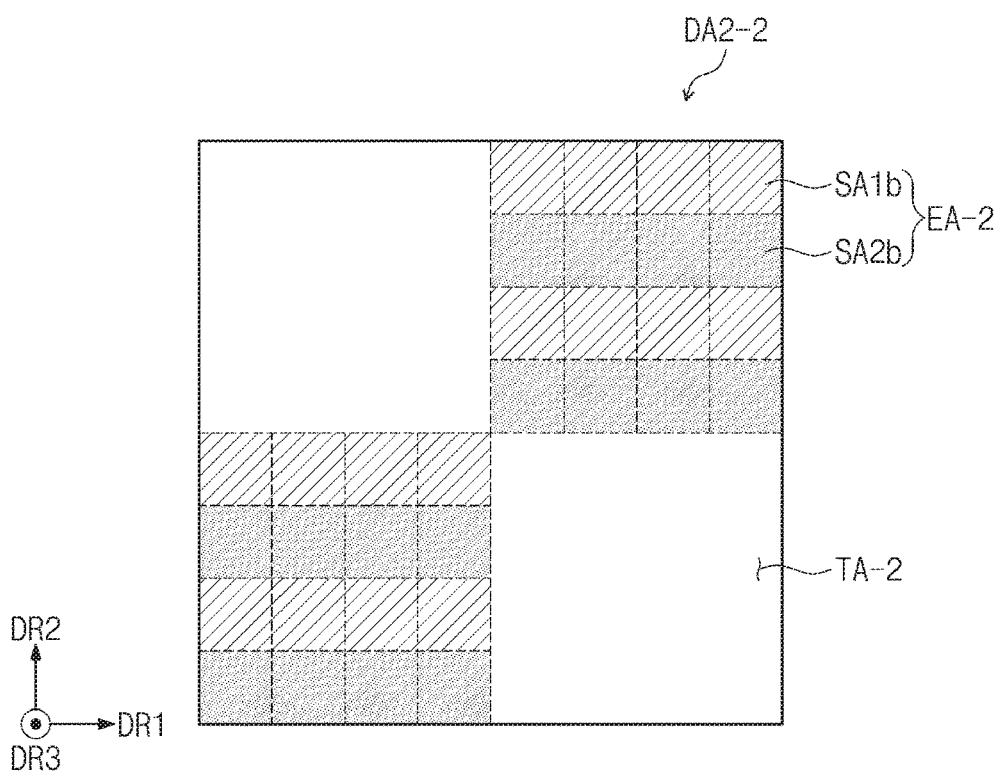
FIG. 18 illustrates an enlarged plan view partially showing a display panel according to embodiments of the present inventive concept.

FIG. 18 illustrates an enlarged plan view partially showing a display panel according to embodiments of the present inventive concept. A second display region DA2-2 is illustrated in an enlarged view showing a portion of one of the second display regions DA2, DA2$a$, and DA2$b$ depicted in FIGS. 4A to 4C.

Referring to FIG. 18, the second display region DA2-2 may include emission regions EA-2 and transmission regions TA-2. An area of each of the transmission regions TA-2 may correspond to that of each of the emission regions EA-2.

Each of the emission regions EA-2 may include sixteen sub-light emitting regions SA1$b$ and SA2$b$. The sub-light emitting regions SA1$b$ and SA2$b$ may include first sub-light emitting regions SA1$b$ and second sub-light emitting regions SA2$b$. In an embodiment, each of the emission regions EA-2 may include eight first sub-light emitting regions SA1$b$ and eight second sub-light emitting regions SA2$b$. The first sub-light emitting regions SA1$b$ may be arranged in the second direction DR2, and the second sub-light emitting regions SA2$b$ may be arranged in the second direction DR2. In addition, the first sub-light emitting regions SA1$b$ and the second sub-light emitting regions SA2$b$ may be alternately arranged in the first direction DR1.

Figure 19:
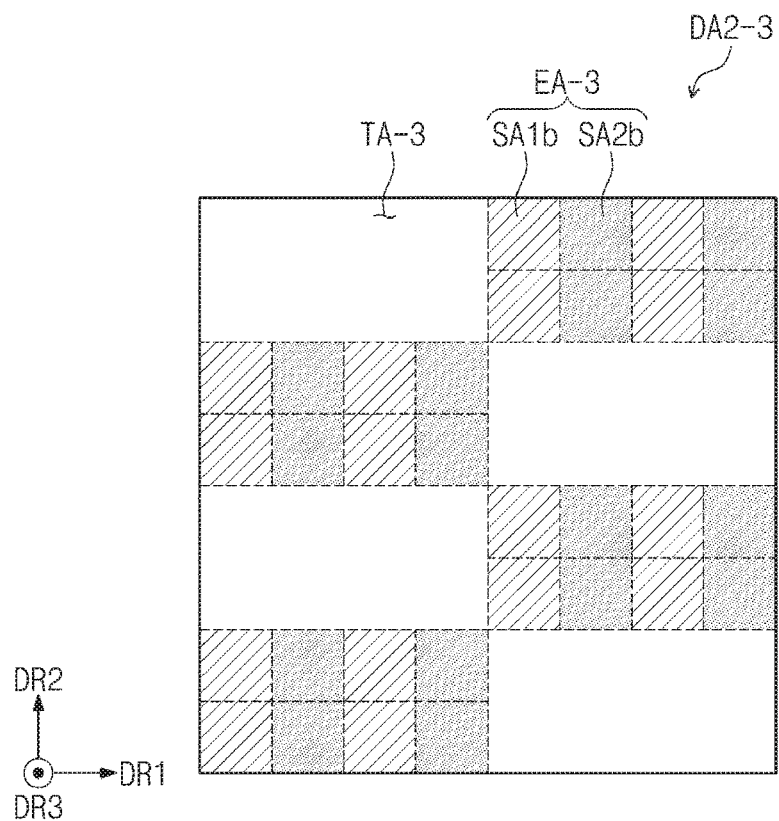
FIG. 19 illustrates an enlarged plan view partially showing a display panel according to embodiments of the present inventive concept.

FIG. 19 illustrates an enlarged plan view partially showing a display panel according to embodiments of the present inventive concept. A second display region DA2-3 is illustrated in an enlarged view showing a portion of one of the second display regions DA2, DA2$a$, and DA2$b$ depicted in FIGS. 4A to 4C.

Referring to FIG. 19, the second display region DA2-3 may include emission regions EA-3 and transmission regions TA-3. An area of each of the transmission regions TA-3 may correspond to that of each of the emission regions EA-3.

Each of the emission regions EA-3 may include eight sub-light emitting regions SA1$b$ and SA2$b$. The sub-light emitting regions SA1$b$ and SA2$b$ may include first sub-light emitting regions SA1$b$ and second sub-light emitting regions SA2$b$. In an embodiment, each of the emission regions EA-3 may include four first sub-light emitting regions SA1$b$ and four second sub-light emitting regions SA2$b$. The first sub-light emitting regions SA1$b$ may be arranged in the second direction DR2, and the second sub-light emitting regions SA2$b$ may be arranged in the second direction DR2. In addition, the first sub-light emitting regions SA1$b$ and the second sub-light emitting regions SA2$b$ may be alternately arranged in the first direction DR1.

Figure 20:
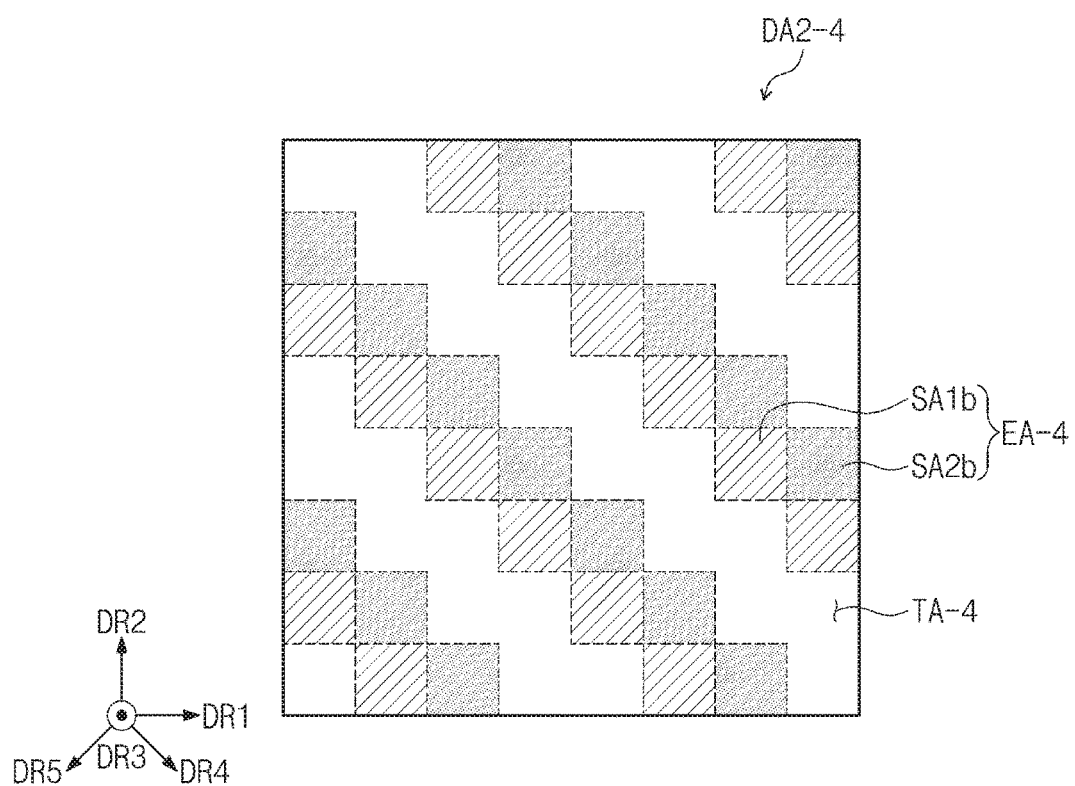
FIG. 20 illustrates an enlarged plan view partially showing a display panel according to embodiments of the present inventive concept.

FIG. 20 illustrates an enlarged plan view partially showing a display panel according to embodiments of the present inventive concept. A second display region DA2-4 is illustrated in an enlarged view showing a portion of one of the second display regions DA2, DA2a, and DA2b depicted in FIGS. 4A to 4C.

Referring to FIG. 20, the second display region DA2-4 may include emission regions EA-4 and transmission regions TA-4. The emission regions EA-4 and the transmission regions TA-4 may each extend along a fourth direction DR4. The fourth direction DR4 may intersect the first and second directions DR1 and DR2. The emission regions EA-4 and the transmission regions TA-4 may be alternately arranged in a fifth direction DR5. The fifth direction DR5 may intersect the fourth direction DR4. The fifth direction DR5 may also intersect the first direction DR1 and the second direction DR2.

Each of the emission regions EA-4 may include sub-light emitting regions SA1b and SA2b. The sub-light emitting regions SA1b and SA2b may be arranged in a stepwise shape. For example, when viewed on a plane, a second sub-light emitting region SA2b may be disposed laterally to one side of a first sub-light emitting region SA1b. The first sub-light emitting region SA1b may be disposed below the second sub-light emitting region SA2b. The first sub-light emitting region SA1b and the second sub-light emitting region SA2b may be repeatedly arranged, as discussed above, to allow each of the emission regions EA-4 to have a stepwise shape. A shape of each of the transmission regions TA-4 may correspond to that of adjacent emission regions EA-4. Therefore, each of the transmission regions TA-4 may also have a stepwise shape.

Figure 21:
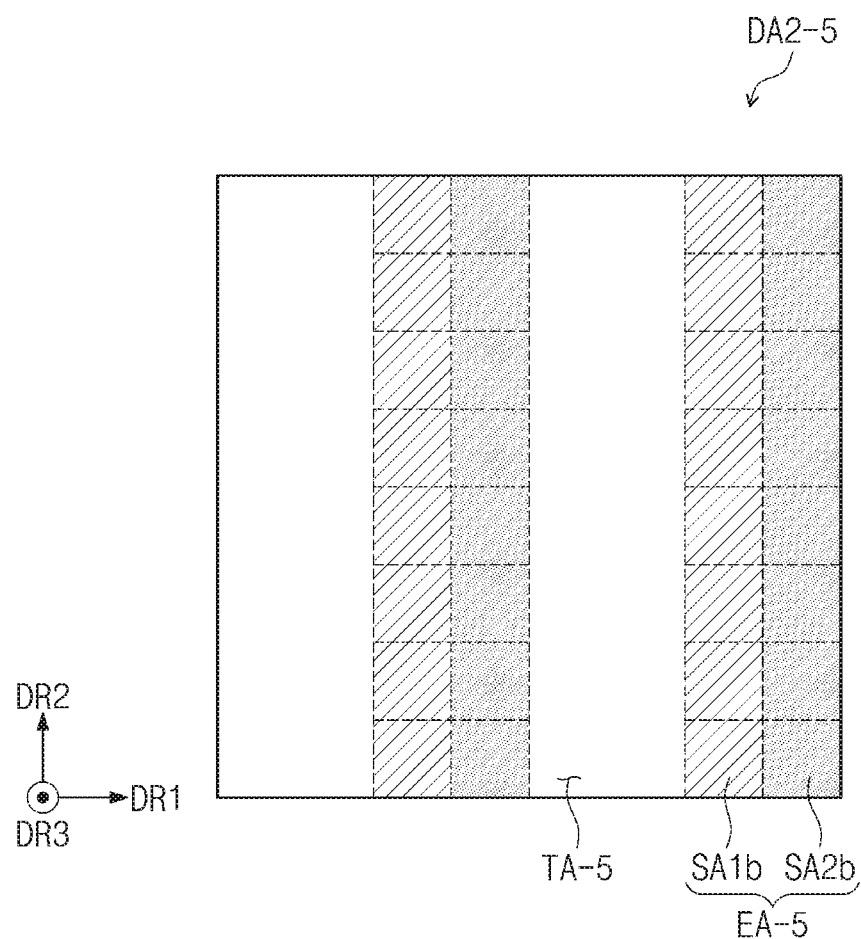
FIG. 21 illustrates an enlarged plan view partially showing a display panel according to embodiments of the present inventive concept.

FIG. 21 illustrates an enlarged plan view partially showing a display panel according to embodiments of the present inventive concept. A second display region DA2-5 is illustrated in an enlarged view showing a portion of one of the second display regions DA2, DA2a, and DA2b depicted in FIGS. 4A to 4C.

Referring to FIG. 21, the second display region DA2-5 may include emission regions EA-5 and transmission regions TA-5. The emission regions EA-5 and the transmission regions TA-5 may each extend along the second direction DR2. The emission regions EA-5 and the transmission regions TA-5 may be alternately arranged in the first direction DR1.

Each of the emission regions EA-5 may include sub-light emitting regions SA1b and SA2b. The sub-light emitting regions SA1b and SA2b may include first sub-light emitting regions SA1b and second sub-light emitting regions SA2b. The first sub-light emitting regions SA1b may be arranged in the second direction DR2, and the second sub-light emitting regions SA2b may be arranged in the second direction DR2. In addition, the first sub-light emitting regions SA1b and the second sub-light emitting regions SA2b may be alternately arranged in the first direction DR1.

According to embodiments of the present inventive concept, a pixel electrode adjacent to a transmission region of a display panel may be shifted from an emission layer in a direction away from the transmission region. Accordingly, an emission region may have an increased transmittance at a portion adjacent to a pixel region. As a result, increased sensitivity may be provided to an electronic module disposed below the display panel.

Although the embodiments have been described with reference to a number of illustrative examples thereof, it will be understood by those of ordinary skill in the art that various changes in form and details may be made without departing from the spirit and scope of the present inventive concept as set forth in the following claims. Thus, the technical scope of the present inventive concept is not limited by the embodiments and examples described above, but by the following claims.

What is claimed is:

1. A display panel, comprising:
a base layer that includes a first region and a second region, the second region including a first sub-region and a second sub-region, wherein the second sub-region corresponds to a transmission region;
a plurality of first pixels on the first region; and
a plurality of second pixels on the first sub-region, wherein
each of the plurality of first pixels includes a first pixel electrode, a first emission layer on the first pixel electrode, and a first common electrode on the first emission layer,
each of the plurality of second pixels includes a second pixel electrode, a second emission layer on the second pixel electrode, and a second common electrode on the second emission layer, and
the second pixel electrode is shifted relative to the second emission layer in a direction away from the second sub-region such that the second pixel electrode does not overlap an edge of the second emission layer closest among all edges of the second emission layer to the second sub-region.

2. The display panel of claim 1, wherein
each of the first and second sub-regions is provided in plural,
the plurality of first sub-regions and the plurality of second sub-regions are defined alternately in a first direction, and
the plurality of first sub-regions and the plurality of second sub-regions are defined alternately in a second direction intersecting the first direction.

3. The display panel of claim 1, wherein
the first sub-region and the second sub-region are adjacent to each other in a first direction, and
when viewed on a plane, a center of an overlapping region where the second emission layer overlaps the second pixel electrode is spaced apart in the first direction from a center of the second emission layer.

4. The display panel of claim 3, wherein, when viewed on a plane, a center of an overlapping region where the first emission layer overlaps the first pixel electrode is spaced apart from a center of the first emission layer in a direction opposite to the first direction.

5. The display panel of claim 1, wherein each of the first emission layer, the first pixel electrode, the second emission layer, and the second pixel electrode has a quadrangular shape when viewed on a plane.

6. The display panel of claim 1, wherein
when viewed on a plane, an area of the first emission layer is greater than an area of the first pixel electrode, and
when viewed on a plane, an area of the second emission layer is greater than an area of the second pixel electrode.

7. The display panel of claim 1, wherein
the first sub-region and the second sub-region are adjacent to each other in a first direction,
a first overlapping region is defined where the first pixel electrode overlaps the first emission layer,
a second overlapping region is defined where the second pixel electrode overlaps the second emission layer,
the first overlapping region is spaced apart from the second overlapping region in a second direction intersecting the first direction, and an imaginary line dose not overlap a center of the first overlapping region, the imaginary line penetrating a center of the second overlapping region and extending in the second direction.

8. The display panel of claim 1, wherein no pixel is disposed on the second sub-region.

9. The display panel of claim 1, wherein
the first emission layer is provided in plural,
the second emission layer is provided in plural, and
the plurality of first emission layers and the plurality of second emission layers are arranged in the same way.

10. The display panel of claim 1, wherein
the first pixel electrode is provided in plural,
the second pixel electrode is provided in plural,
the plurality of first pixel electrodes are arranged in a first way, and
the plurality of second pixel electrodes are arranged in a second way different from the first way.

11. The display panel of claim 1, wherein
the first sub-region and the second sub-region are adjacent to each other in a first direction,
each of the first and second pixels includes a plurality of first pixel emission regions, a plurality of second pixel emission regions, and a plurality of third pixel emission regions,
the first pixel emission regions and the second pixel emission regions are alternately arranged along a second direction intersecting the first direction,
the second pixel emission regions and the third pixel emission regions are alternately arranged along the second direction,
the second pixel emission regions are spaced apart in the first direction from the third pixel emission regions, and
the first pixel emission regions are spaced apart in the first direction from the second pixel emission regions.

12. The display panel of claim 11, wherein
the number of the first pixel emission regions on the first sub-region is two,
the number of the second pixel emission regions on the first sub-region is four,
the number of the third pixel emission regions on the first sub-region is two,
the first pixel emission regions are light emitting regions of a red pixel,
the second pixel emission regions are light emitting regions of a green pixel, and
the third pixel emission regions are light emitting regions of a blue pixel.

13. The display panel of claim 1, wherein
the first sub-region and the second sub-region are adjacent to each other in a first direction,
the first pixel electrode is provided in plural,
the second pixel electrode is provided in plural, and
a first minimum distance between the plurality of first pixel electrodes that are spaced apart in the first direction is greater than a second minimum distance between the plurality of second pixel electrodes that are spaced apart in the first direction.

14. The display panel of claim 1, wherein a size of the first pixel electrode is greater than a size of the second pixel electrode.

* * * * *